(12) United States Patent
Suzuki et al.

(10) Patent No.: US 9,780,275 B2
(45) Date of Patent: Oct. 3, 2017

(54) METHOD FOR MANUFACTURING LIGHT EMITTING DEVICE

(71) Applicant: NICHIA CORPORATION, Anan-shi, Tokushima (JP)

(72) Inventors: Ryo Suzuki, Anan (JP); Yoshikazu Takeuchi, Komatsushima (JP); Hirokazu Sasa, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/361,630

(22) Filed: Nov. 28, 2016

(65) Prior Publication Data
US 2017/0077373 A1     Mar. 16, 2017

Related U.S. Application Data

(62) Division of application No. 14/716,451, filed on May 19, 2015, now Pat. No. 9,543,465.

(30) Foreign Application Priority Data

May 20, 2014  (JP) ................................. 2014-104248
Jan. 30, 2015  (JP) ................................. 2015-017629

(51) Int. Cl.
*H01L 33/00*        (2010.01)
*H01L 33/64*        (2010.01)
(Continued)

(52) U.S. Cl.
CPC .......... *H01L 33/641* (2013.01); *H01L 33/007* (2013.01); *H01L 33/0079* (2013.01);
(Continued)

(58) Field of Classification Search
CPC . H01L 33/641; H01L 33/007; H01L 33/0095; H01L 33/28; H01L 33/32;
(Continued)

(56) References Cited

U.S. PATENT DOCUMENTS

2008/0036362 A1   2/2008  Tanimoto et al.
2010/0320479 A1  12/2010  Minato et al.
(Continued)

FOREIGN PATENT DOCUMENTS

JP     2007-109822 A    4/2007
JP     2008-521210 A    6/2008
(Continued)

*Primary Examiner* — Armando Rodriguez
(74) *Attorney, Agent, or Firm* — Global IP Counselors, LLP

(57) ABSTRACT

A method for manufacturing a light emitting device includes preparing a light emitting element that includes a light transmissive substrate comprising a first main surface, a second main surface, and a side surface having a light transmitting part and a light absorbing part whose optical transmissivity is lower than that of the light transmitting part, and a semiconductor laminate that is provided to the first main surface of the light transmissive substrate, joining the light emitting element to an upper surface of a base body such that the base body is opposite to the side where the semiconductor laminate is provided, providing a support member that covers the side surface of the light emitting element and part of the base body, and removing the light absorbing part by thinning the light transmissive substrate from the second main surface side.

15 Claims, 10 Drawing Sheets

(51) Int. Cl.
*H01L 33/28* (2010.01)
*H01L 33/32* (2010.01)
*H01L 33/50* (2010.01)
*H01L 33/56* (2010.01)
*H01L 33/60* (2010.01)
*H01L 33/62* (2010.01)

(52) U.S. Cl.
CPC .......... *H01L 33/0095* (2013.01); *H01L 33/28* (2013.01); *H01L 33/32* (2013.01); *H01L 33/502* (2013.01); *H01L 33/56* (2013.01); *H01L 33/60* (2013.01); *H01L 33/62* (2013.01); H01L 2933/005 (2013.01); H01L 2933/0041 (2013.01); H01L 2933/0058 (2013.01); H01L 2933/0066 (2013.01)

(58) Field of Classification Search
CPC ......... H01L 33/56; H01L 33/60; H01L 33/62; H01L 33/0079; H01L 33/50; H01L 33/52; H01L 33/54; H01L 33/502; H01L 2933/0058; H01L 2933/0066
See application file for complete search history.

(56) References Cited

U.S. PATENT DOCUMENTS

| | | |
|---|---|---|
| 2011/0233586 A1 | 9/2011 | Kojima et al. |
| 2012/0248484 A1 | 10/2012 | Sato et al. |
| 2014/0080235 A1 | 3/2014 | Yajima et al. |
| 2015/0021642 A1 | 1/2015 | Nakabayashi |
| 2015/0171281 A1 | 6/2015 | Nakabayashi et al. |

FOREIGN PATENT DOCUMENTS

| | | |
|---|---|---|
| JP | 2010-251807 A | 11/2010 |
| JP | 2011-199193 A | 10/2011 |
| JP | 2012-069645 A | 4/2012 |
| JP | 2012-104778 A | 5/2012 |
| JP | 2012-104779 A | 5/2012 |
| JP | 2012-104780 A | 5/2012 |
| JP | 2012-216713 A | 11/2012 |
| JP | 2013-084989 A | 5/2013 |
| JP | 2014-078678 A | 5/2014 |
| JP | 2014-107307 A | 6/2014 |

METHOD FOR MANUFACTURING LIGHT EMITTING DEVICE

CROSS-REFERENCE TO RELATED APPLICATIONS

This application is a divisional application of U.S. patent application Ser. No. 14/716,451 filed on May 19, 2015. This application claims priority to Japanese Patent Applications No. 2014-104248 filed on May 20, 2014 and No. 2015-017629 field on Jan. 30, 2015. The entire disclosures of U.S. patent application Ser. No. 14/716,451, and Japanese Patent Applications No. 2014-104248 and No. 2015-017629 are hereby incorporated herein by reference.

BACKGROUND

Technical Field

The present disclosure relates to a method for manufacturing a light emitting device.

Related Art

Many different light sources have been used in electronic devices. For instance, compact, thin light emitting devices have been used as backlight light sources in the display panels and the like of electronic devices. A small (approximately chip scale) light emitting devices are proposed (for example, JP2008-521210A).

On the other hand, among methods for manufacturing a thin semiconductor light emitting element, there are those in which a semiconductor laminate is formed on the first main surface of a light transmissive substrate, the light transmissive substrate and the semiconductor laminate are divided to individual light emitting element, and the second main surface of the light transmissive substrate is polished (for example, JP2012-104778A, JP2012-104779A, JP2012-104780A, JP2007-109822A, etc.). For the division, dividing grooves are formed in the second main surface of the light transmissive substrate. The dividing grooves can be formed by laser scribing, for example. Laser scribing involves irradiating a high-energy laser beam along the dividing line of the light transmissive substrate. The portion irradiated by the laser beam is altered. The light transmissive substrate and the semiconductor laminate can be divided along this altered portion.

The altered portion remains in the light transmissive substrate after the division. This altered region becomes a light absorbing region that absorbs the light emitted from the light emitting element. Thus, when the light transmissive substrate is polished to minimize the decrease in emission intensity of the light emitting element, the thickness of the light transmissive substrate is reduced until the altered region is removed.

In the course of this light emitting device manufacturing process, even though the individual light emitting elements are not easy to handle because they are small and thin, adequate strength needs to be ensured in the course of manufacturing during packaging, and particularly in flip-chip mounting.

SUMMARY

A method for manufacturing a light emitting device according to another aspect of the present invention includes:

preparing a light emitting element that includes a light transmissive substrate comprising a first main surface, a second main surface, and a side surface having a light transmitting part and a light absorbing part whose optical transmissivity is lower than that of the light transmitting part, and a semiconductor laminate that is provided to the first main surface of the light transmissive substrate;

joining the light emitting element to an upper surface of a base body such that the base body is opposite the side where the semiconductor laminate is provided;

providing a support member that covers the side surface of the light emitting element and part of the base body; and removing the light absorbing part by thinning the light transmissive substrate from the second main surface side.

DETAILED DESCRIPTION

Figure 1A:
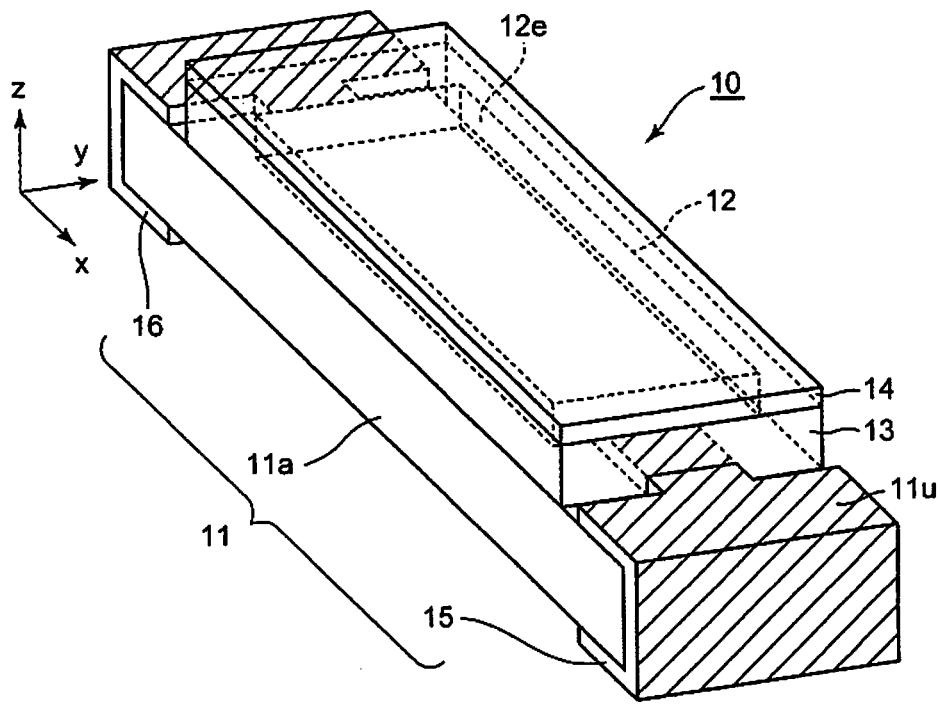
FIG. 1A is a diagrammatic perspective view illustrating a light emitting device manufactured by a method of an embodiment of the present invention.

Hereinafter, embodiments of the present invention will be described with reference to the drawings as appropriate. It is to be noted that the method for manufacturing the light emitting device described below is intended for implementing the technical concept of the present invention, and the present invention is not limited to those described below unless otherwise specified. Matters described in one embodiment and example are applicable to other embodiments and examples. The size, positional relationship and so on of members shown in the drawings may be exaggerated for clarifying the descriptions.

In the present disclosure, light emitting devices are so called a side view type light emitting devices in which a surface intersecting a mounting surface (side surface) of the light emitting device is a light extraction surface are mainly described, but the method of the present disclosure can also be applied to so called a top view type light emitting device in which a surface opposite to a light extraction surface is a mounting surface In this description, a light extraction surface of the light emitting device is referred to as an upper surface, and a surface neighboring or intersecting the light extraction surface is referred to as a side surface. And when side emitting type light emitting device is described, one of the side surfaces is referred to as a mounting surface of the light emitting device. Also, among the surfaces of elements or members that form the light emitting device, a surface corresponding to the light extraction surface of the light emitting device may be referred to as a first main surface or front surface (i.e. upper surface), a surface opposite to the first main surface may be referred to as a second main surface (i.e. lower surface), and a surface neighboring or intersecting the first main surface and the second main surface (i.e. surface corresponding to the side surface of the light emitting device) may be referred to as an end surface.

The method for manufacturing a light emitting device of the present disclosure may include the steps of:

(a) preparing a base body;
(b) preparing a light emitting element;
(c) mounting the light emitting element on the base body;
(d) covering the light emitting element with a sealing member; and
(e) removing part of the sealing member and the substrate.

With this manufacturing method, there may further be a step of forming a light transmissive member, and the light emitting element may be further subjected to surface treatment after a substrate has been removed.

It can provide small, thin light emitting devices can be manufactured easily, conveniently, or high yield.

The above manufacturing method can give a light emitting device, which mainly includes a base body, a light emitting element, and a sealing member, for example.

Figure 1B:
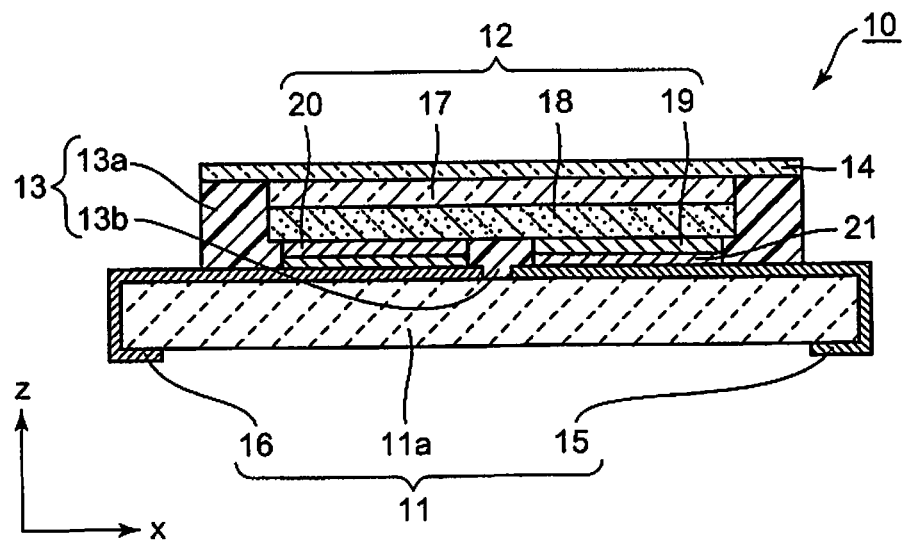
FIG. 1B is a schematic longitudinal sectional view illustrating a light emitting device of FIG. 1A.

As shown in FIGS. 1A and 1B, a light emitting device 10 in the present embodiment includes a base body 11, a light emitting element 12 mounted on the upper surface 11$u$ of the base body 11, and a support member 13 that surrounds the light emitting element 12. The light emitting device 10 may also include a wavelength conversion member 14 on the upper surface 12$u$ side of the light emitting element 12 (corresponds to the light emission surface 12$e$ of the light emitting element 12).

As shown in FIG. 1B, the light emitting element 12 in the present embodiment includes a light transmissive substrate 17 and a semiconductor laminate 18 provided on the lower surface side of the light transmissive substrate 17. The semiconductor laminate 18 is produced by laminating a first conduction-type semiconductor layer (such as an n-type semiconductor layer), an active layer, and a second conduction-type semiconductor layer (such as a p-type semiconductor layer), in that order starting from the lower surface side of the light transmissive substrate 17. A pair of electrodes (a first electrode 19 and a second electrode 20) is provided on the lower surface of the semiconductor laminate 18.

The base body 11 of the light emitting device 10 in the present embodiment is a member on which the light emitting element 12 is mounted. The base body 11 includes a base material 11$a$ that is an electrically insulating flat piece that is rectangular in plan view, and a pair of connection terminals 15 and 16 provided to the surface of the base material 11$a$. The connection terminals 15 and 16 are provided so as to cover part of the upper surface of the base material 11$a$. As shown in FIG. 1B, the first connection terminal 15 is connected to the first electrode 19 of the light emitting element 12, and the second connection terminal 16 is connected to the second electrode 20 of the light emitting element 12. In other words, the ends of the first connection terminal 15 and the second connection terminal 16 are respectively formed at positions corresponding to the first electrode 19 and the second electrode 20 of the light emitting element 12. The connection terminals 15 and 16 are provided extending from the upper surface of the base material 11$a$, through the side surface, to the lower surface.

The electrodes 19 and 20 of the light emitting element 12 are joined by a conductive joining member 21 to the connection terminals 15 and 16 provided to the upper surface 11$u$ of the base body 11. This allows power to be supply through the connection terminals 15 and 16 to the light emitting element 12.

The support member 13 in the present embodiment covers part of the base body 11 and the side surface of the light emitting element 12 joined on the base body 11 by the joining member 21. Providing the support member 13 allows the light emitting element 12 to be supported more securely on the base body 11. The support member 13 covers both part of the light emitting element 12 and part of the base body 11, and thereby fixes the light emitting element 12 to the base body 11. The support member 13 can include a first portion 13$a$ that covers a side surface 12$s$ of the light emitting element 12, and the portion of the upper surface 11$u$ of the base body 11 that surrounds the light emitting element 12. The first portion 13$a$ of the support member 13 can reduce damage to the light emitting element 12 or separation of the light emitting element 12 from the base body 11 when the light emitting element 12 is subjected to a force in the lateral direction (the x direction or the y direction in FIGS. 1A and 1B). The support member 13 can also include a second portion 13$b$ that fills in the gap between the upper surface 11$u$ of the base body 11 and the lower surface of the light emitting element 12. The second portion 13$b$ of the support member 13 can support the light emitting element 12 from the lower surface side. Thus, there will be less damage to the light emitting element 12 when a downward (−z direction in FIGS. 1A and 1B) force is exerted from the upper surface side of the light emitting element 12.

The wavelength conversion member 14 may be a flat piece or a film of a light transmissive material that contains a phosphor, for example. This phosphor is one that is capable of converting the wavelength of light emitted from the light emitting element 12. The wavelength conversion member 14 may cover at least the light emission surface 12$e$ (the upper surface) of the light emitting element 12. Part of the light emitted from the light emission surface 12$e$ of the light emitting element 12 has its wavelength converted by the wavelength conversion member 14. The wavelength conversion member 14 may also cover the upper surface of the first portion 13$a$ of the support member 13.

Preparation of Base Body

First, a base body, which includes a base material, and a pair of connection terminals corresponding to the positive and the negative, on at least the first main surface of the base material, is prepared. The thickness of the base body can be according to a thickness of the base material to be described below. For example, the thickness of the thickest region is preferably about 500 μm or less, more preferably about 300

µm or less, further preferably about 200 µm or less. The thickness of the thickest region is preferably about 40 µm or more.

The strength of the base body can be adjusted according to a material of the base material to be described below, a material of the connection terminal, and so on. For example, within the above-described thickness range, the flexural strength is preferably 300 MPa or more. The strength of the light emitting device can be compensate reduce of the strength of the light emitting element due to removal of a substrate, and accordingly secured. The flexural strength in the present specification refers to a value measured by using a commercially available strength measuring apparatus, for example, by a three-point flexural test using an Instron machine.

With a thin base body of suitable strength as described above, a light emitting device which is small and thin and has high performance and high reliability can be obtained.

To manufacture a single light emitting device, the base body may allow one or more light emitting elements to be mounted. To manufacture a plurality of light emitting devices, a composite base body may be used in which a plurality of unit base bodies for individual light emitting devices are connected together in rows and columns.

Base Material

Examples of the base material include metals, ceramics, resins, dielectric materials, pulp, glass and paper or composite materials thereof (e.g. composite resins), or composite materials of the above-mentioned materials and conductive materials (e.g. metals, carbon etc.). Examples of the metal include copper, iron, nickel, chromium, aluminum, silver, gold and titanium or those including alloys thereof. Examples of the ceramic include aluminum oxide, aluminum nitride, zirconium oxide, zirconium nitride, titanium oxide and titanium nitride or those including mixtures thereof. Examples of the composite resin include glass epoxy resins.

As the resin, any resin used in the art may be used. Specific examples include epoxy resins, bismaleimide-triazine (BT) resins, polyimide resins, cyanate resins, polyvinyl acetal resins, phenoxy resins, acrylic resins, alkyd resins and urethane resins. Also, as the resins, BT resins containing a naphthalene-based epoxy resin and compositions thereof, commercial products (e.g. H1832NS and HL832NSF type LCA manufactured by Mitsubishi Gas Chemical Company, Inc.; MCL-E-700G and MCL-E-705G manufactured by Hitachi Chemical Company, Ltd.; and the like), and liquid crystal polymers and compositions thereof may be used. They may contain additives, monomers, oligomers, prepolymers and the like which are known in the art. Among those, BT resins or compositions thereof are preferred. The base material, which is made of resin, can be formed by molding a thermosetting resin, etc., or by molding by the mechanical working of a resin block, for example.

It is preferable to use a prepreg substrate of glass modified silicone, glass silicone, or glass epoxy with a relatively low coefficient of linear expansion. For example, it is favorable to use a glass epoxy substrate with low linear expansion, in which a filler and glass cloth used in the field of semiconductor BGA mounting are closely packed to adjust the coefficient of linear expansion to around 1 to 15 ppm. The product of forming a conductive wiring pattern in this base material can be used as the base body.

The heat dissipation of the light emitting device can be improved by using a filler or glass cloth with high heat dissipation as the material of this prepreg substrate. Furthermore, parts can be built into the interior of a multilayer substrate to provide the functions of a protective element, etc.

The base material may be preferably formed of any material which has a linear expansion coefficient within ±10 ppm/° C. with respect to the linear expansion coefficient of the light emitting element to be described below. Accordingly, detachment of the light emitting element from the base body (connection terminal) or undesired stress loading on the light emitting element due to a difference in linear expansion coefficient between the light emitting element and the base body, which have been problems, can be effectively prevented at the time of mounting the light emitting element on the base body. Therefore, electrodes of the light emitting element can be directly connected to connection terminals of the base body by flip-chip mounting without using wares for electrically connecting the light emitting element and the base body, so that a smaller and thinner light emitting device can be provided. In the present invention, the linear expansion coefficient means a value measured by the TMA method. One of $\alpha 1$ and $\alpha 2$ should satisfy this value, but it is more preferred that both $\alpha 1$ and $\alpha 2$ satisfy the value.

The resin has a glass transition temperature of preferably about 250° C. or higher. Accordingly, defects such as a connection failure of the light emitting element can be avoided, without being affected by a temperature change in mounting of the light emitting element. As a result, the production yield of the light emitting device can be improved. The glass transition temperature may be measured by, for example, either a method (TMA, DSC, DTA or the like) in which a change in dynamic properties, and heat absorption or heat generation are measured while the temperature of a sample is slowly elevated or lowered, or a method in which a response of a dynamic viscoelasticity measurement sample is measured while the frequency of a periodic force applied to the sample is changed.

The shape, size, thickness and the like of the base material in one light emitting device may be appropriately set. The thickness of the base material, depending on a material used, the type and a structure of the light emitting element placed, and the like, is, for example, preferably about 500 µm or less, more preferably about 470 µm or less, or about 300 µm or less, and still more preferably about 200 µm or less. The thickness of the base material is preferably about 20 µm or more, and more preferably about 40 µm or more when considering the strength and so on.

The plan view shape of the base material is, for example, a circle, a polygon such as a quadrangle, or a shape close thereto. Among those, a rectangle is preferred. The size is preferably larger than the later-described light emitting element in terms of a plane area. In the case where one light emitting element is mounted on one light emitting device, the length of the light emitting device in the long direction is preferably about 1.5 to 5 times, and the length of the light emitting device in the short direction is preferably about 1.0 to 2.0 times of the length of one side of the light emitting element. When a plurality of light emitting elements are mounted on one light emitting device, the length of the light emitting device can be adjusted according to the number of the light emitting elements. For example, in the case where 2 or 3 light emitting elements in the long direction, the length of the light emitting device in the long direction is preferably about 2.4 to 6.0 times or about 3.6 to 6.0 times of the length of one side of the light emitting element.

On the second main surface of the base material, one or more layers having functions of reinforcement, heat release, a mark for alignment and so on may be provided using an insulator, a metal and the like.

(Connection Terminal)

A pair of connection terminals is formed on at least the first main surface of the base body. In this case, it is preferred that at least a part of the edge of the connection terminal coincides with a part of the edge of the first main surface of the base body. In other words, it is preferred that a part of the end surface of the connection terminal and a part of the mounting surface of the base body are in the same plane. Accordingly, a mounting board and the end surface of the connection terminal can be brought into contact with (or made as closer as possible to) each other in mounting of the light emitting device on the mounting board. As a result, the mountability of the light emitting device can be improved.

The connection terminal has on the first main surface an element connection section connected to the electrode of the light emitting element and an external connection section connected to the outside of the light emitting device. It is preferred that the external connection section is provided on the second main surface of the base body in addition to the first main surface of the base body. The connection terminal may be provided so as to extend from the first main surface onto a surface present between the first main surface and the second main surface, or provided so as to extend from the first main surface onto the second main surface through a via or a through-hole etc. provided so as to extend through the base material.

The connection terminal is not necessarily required to have the same width (e.g. length of the base body in the short direction) over the first main surface, the end surface and/or the second main surface of the base body, and may be formed so as to be only partially reduced or increased in width. Alternatively, the connection terminal may be partially covered with an insulating material (e.g. base material) so as to be reduced in width at the first main surface and/or the second main surface of the base body. Such a width-reduced region is preferably disposed on at least the first main surface of the base body, and more preferably in the vicinity of the later-described sealing member.

By disposing such a width-reduced region, a situation can be suppressed in which a bonding member such as that to be described below, etc. which is connected to the connection terminal, or flux or the like contained therein penetrates to below the later-described sealing member and further to below the light emitting element along the surface of the terminal. By separating the element connection section from the end surface of the base body extending along the long direction, penetration of the flux can be suppressed in the same manner as described above when the light emitting element is mounted.

The base body may have a heat releasing terminal, a heat sink, a reinforcement member and so on in addition to the connection terminal electrically connected to the light emitting element. They may be disposed on any of the first main surface, the second main surface and the end surface, and in particular, preferably disposed below the light emitting element and/or the sealing member. The strength and reliability of the light emitting device can be accordingly enhanced. By enhancing the strength of the base body, distortion of the base body is reduced, so that moldability of the sealing member can be improved when the sealing member is molded using a mold.

Further, when a plurality of light emitting elements are disposed in one light emitting device, the light emitting device may include one or more additional connection terminals for electrically connecting the plurality of light emitting elements. The shape, position and the like of the connection terminal can be appropriately set according to the number of light emitting elements mounted on one base body, and the arrangement and connection form (parallel or series) thereof, etc.

The connection terminal can be formed from, for example, a single-layer film or laminated film of Au, Pt, Pd, Rh, Ni, W, Mo, Cr, Ti, Fe, Cu, Al, Ag or an alloy thereof. Among those, one excellent in conductivity and mountability is preferred, and a material having good bondability and wettability with the bonding member on the mounting side is more preferred. Particularly, copper or a copper alloy is preferred from the viewpoint of heat releasability. A film having a high light reflectivity, such as a single-layer film or laminated film of silver, platinum, tin, gold, copper, rhodium or an alloy thereof may be formed on the surface of the connection terminal. Specific examples of the structure of the connection terminal include laminated structures such as W/Ni/Au, W/Ni/Pd/Au, W/NiCo/Pd/Au, Cu/Ni/Cu/Ni/Pd/Au, Cu/Ni/Pd/Au, Cu/Ni/Au, Cu/Ni/Ag and Cu/Ni/Au/Ag. The connection terminals may each be substantially flat, or the thickness or the number of layers may partially vary. That is, the connection terminals may have irregularities on a surface.

For the connection terminal, a wire, a lead frame or the like may be used, but it is preferred to form a film of the above-described material by plating so that the connection terminal is substantially flat on the surface of the base body or forms the same plane with the base body. The thickness of the connection terminal is several µm to several tens µm.

Protrusions that are joined to the first electrode and the second electrode of the light emitting element may be formed on the connection terminals. This makes it easier for the sealing member to fill in between the base body and the light emitting element, and reduces the transmission of light emitted from the light emitting element to the base body side. Also, the light emitting element and the base body can be joined securely, reducing the risk of damage to the light emitting element during removal of the sealing member and the substrate. Furthermore, this enhances the reliability of the light emitting device after manufacture.

The shape of the upper surfaces of the protrusions are preferably substantially the same as the shape of the electrodes of the light emitting element to which they are joined. This makes it easier to mount the base body to the light emitting element, due to the self-alignment effect.

The protrusions can be formed by providing bumps on the flat connection terminals, or by varying the thickness of the base material under the connection terminals, or by varying the thickness of the connection terminals formed on the flat base material, or using a combination of these, for example.

As long as the linear expansion coefficient of the base material described above is not considerably impaired, the base body may itself form a protective element such as a capacitor, a varistor, a zener diode or a bridge diode, or may include a structure, which performs the function of these elements, as a part thereof in the form of, for example, a multilayer structure or a laminated structure. By using one that performs the above-mentioned element function, the base body can be made to function as a light emitting device without additionally carrying components. As a result, a high-performance light emitting device having improved electrostatic withstand voltage can be made smaller.

The base body is not limited to one that includes a base material and connection terminals, and can instead be formed only from a metal film or a metal sheet that will become the connection terminals, for example. It may be the product of integrally molding metal leads and a molding resin. In this case, first a base body is prepared that includes the base material and the connection terminals, and a step of removing the base material may be added as a subsequent step to the method for manufacturing a light emitting device. In the case where the light emitting device has no base material, this allows the light emitting device to be thinner or smaller.

Preparation of Light Emitting Element

The light emitting element includes a substrate (hereinafter sometimes referred to as a wafer, a light transmissive substrate, a growth substrate, etc.), a semiconductor laminate that is laminated on this substrate, and a pair of electrodes formed on the surface of the semiconductor laminate.

Examples of the substrate of the light emitting element include those capable of epitaxial growing a semiconductor layer. Examples of the material of the substrate include insulating substrates such as those of sapphire ($Al_2O_3$) and spinel ($MgAl_2O_4$), and the above-described nitride-based semiconductor substrates. The thickness of the substrate before removing is preferably about 100 µm to about 500 µm, more preferably about 150 µm for about 300 µm. In the case where the substrate are not completely removed from the light emitting element, it is preferably made of light transmissive materials such as sapphire, SiC.

The substrate may have a plurality of projection portions or irregularities on a surface thereof. The substrate may have an off angle of about 0 to 10° with respect to a predetermined crystal plane such as the C plane or the A plane. The substrate may have a semiconductor layer, an insulating layer or the like as an intermediate layer, a buffer layer, an under-layer or the like between the board and the first semiconductor layer.

The semiconductor laminate may be formed by laminating a first semiconductor layer (e.g. n-type semiconductor layer), a light emitting layer and a second semiconductor layer (e.g. p-type semiconductor layer) in this order, and contributes to light emission. The semiconductor laminate has, on the same surface (e.g. surface on the second semiconductor layer side), both a first electrode (positive or negative) electrically connected to the first semiconductor layer and a second electrode (negative or positive) electrically connected to the second semiconductor layer.

Examples of the type and the material of the first semiconductor layer, the light emitting layer and the second semiconductor layer include various semiconductors such as group III-V compound semiconductors and group II-VI compound semiconductors. Specific examples include nitride-based semiconductor materials such as $In_XAl_YGa_{1-X-Y}N$ ($0 \leq X$, $0 \leq Y$, $X+Y \leq 1$), and InN, AlN, GaN, InGaN, AlGaN, InGaAlN and the like can be used. For the film thickness and the layer structure of each layer, those known in the art can be used.

The shape of the semiconductor laminate is preferably square or close to square. The size of the semiconductor laminate can be suitably adjusted according to the size of the light emitting device. For instance, the length of one side of the semiconductor laminate is from a few hundred microns to about 2 mm. In the case where the light emitting device is a side view type, it preferably has a rectangular shape in which the ratio of the length of the sides in the lengthwise direction and the short-side direction is about 2:1 to 50:1. It is difficult to increase the thickness of a side view type of light emitting device, which needs to be thin, but a light emitting device with high output can be obtained by mounting the light emitting element that is thus longer in the lengthwise direction.

First Electrode and Second Electrode

Preferably, the first electrode and the second electrode are formed on the same surface (surface opposite to the substrate in the presence of the substrate) of the semiconductor laminate. Accordingly, flip-chip mounting can be performed with the positive and negative connection terminals of the base body made opposite to the first electrode and the second electrode of the light emitting element.

The first electrode and the second electrode can be formed from, for example, a single-layer film or laminated film of Au, Pt, Pd, Rh, Ni, W, Mo, Cr, Ti and the like or an alloy thereof. Specific examples include laminated films laminated like Ti/Rh/Au, W/Pt/Au, Rh/Pt/Au, W/Pt/Au, Ni/Pt/Au and Ti/Rh from the semiconductor layer side. The film thickness may be any film thickness of films that are used in the art.

In the first electrode and the second electrode, on sides close to the first semiconductor layer and the second semiconductor layer, respectively, it is preferred that each electrode is provided with, as a part of the electrode, a material layer having a higher reflectivity to light emitted from the light emitting layer as compared to other materials of the electrode. Examples of the high-reflectivity material include silver or silver alloys and aluminum. In the case where silver or a silver alloy is used, it is preferred to form a covering layer that covers a surface (preferably the upper surface and the end surface) of the material layer for preventing migration of silver. The above-mentioned covering layer should be one formed of a metal or an alloy that is usually used as a conductive material, and the covering layer is, for example, a single layer or a laminated layer containing aluminum, copper, nickel and the like.

As long as the first electrode and the second electrode are electrically connected to the first semiconductor layer and the second semiconductor layer, respectively, the entire surface of the electrode is not required to be in contact with the semiconductor layer, or the first electrode is not required to be situated wholly on the first semiconductor layer and the second electrode is not required to be situated wholly on the second semiconductor layer.

The shape of each of the first electrode and the second electrode can be set according to a shape of the semiconductor laminate, a shape of the connection terminal (more specifically the element connection section) of the base body, or the like. Preferably, the first electrode, the second electrode and the element connection section each have a quadrangle shape in plan view or a shape close thereto. In the case where the shape of each of the first electrode and the second electrode is substantially the same as the shape of the corresponding element connection section, bonding and registering of the semiconductor laminate with the base body can be easily performed by making use of a self-alignment effect. In this case, it is preferred that the plane shapes of the first electrode and the second electrode are substantially the same at least at the outermost surface of the semiconductor laminate connected to the base body.

Protrusions that are connected to the connection terminals of the base body may be formed on the upper surfaces of the first electrode and the second electrode. This makes it easier for the sealing member to fill in between the base body and the light emitting element, and reduces the transmission of light emitted from the light emitting element to the base body. Also, the light emitting element and the base body can be joined securely, reducing the risk of damage to the light emitting element during removal of the sealing member and the substrate. Furthermore, this enhances the reliability of the light emitting device after manufacture.

The upper surface shape of the protrusions provided to the electrodes of the light emitting element is preferably substantially the same as the planar shape of the portion of the connection terminals mounted on the light emitting element. This makes it easier to mount the base body to the light emitting element, due to the self-alignment effect.

These protrusions are provided at the desired height from the upper surfaces of the electrodes where the protrusions are formed, and are preferably provided at a height of about a few microns to 100 μm, for example.

The thickness of the light emitting element before the substrate is removed is preferably no more than 800 μm, as the thickness including the electrodes and the substrate used for semiconductor growth, more preferably no more than 500 μm, still more preferably no more than 400 μm, no more than 300 μm or no more than 200 μm, and preferably no less than 150 μm. The size of the light emitting element is preferably no more than several mm on a side, for example, and more preferably no more than one thousand and some hundreds μm.

The light emitting element can be formed by the following method, for example.

Figure 3A:
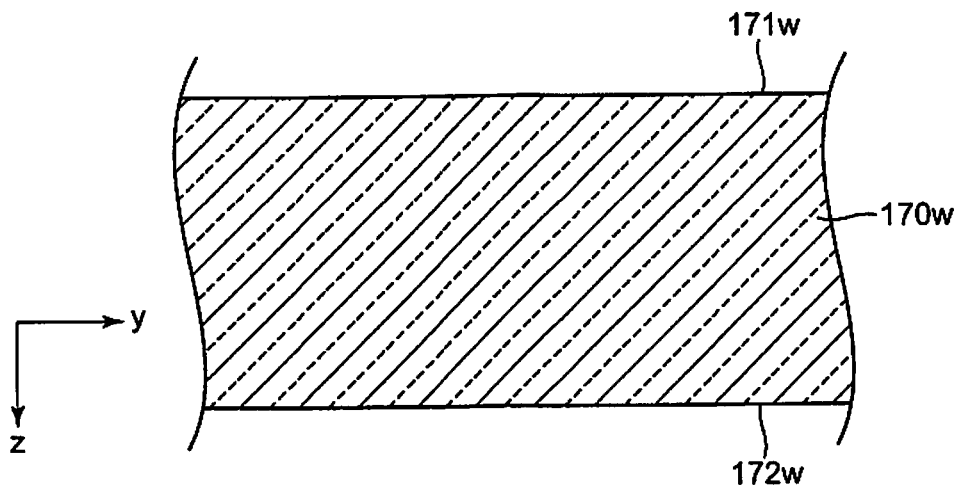
FIGS. 3A to 3C, 3F and 3H are schematic sectional views for illustrating a method of a light emitting device of another embodiment of the present invention.
Figure 3B:
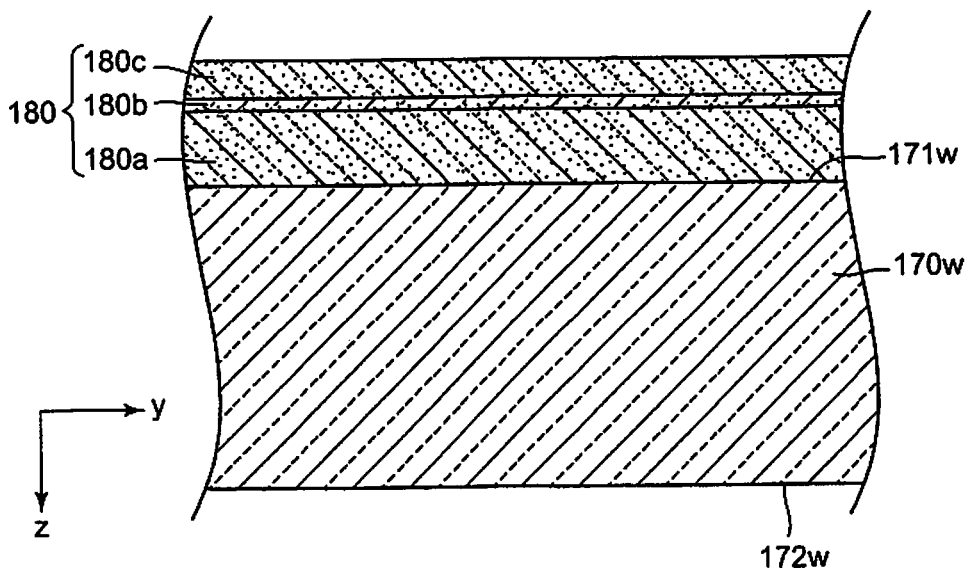

First, a wafer 170W composed of a light transmissive material is prepared (see FIG. 3A). The wafer 170W is a growth substrate for growing a semiconductor laminate 18 of a light emitting element 120. The semiconductor laminate 180 is formed on a first main surface 171W of the wafer 170W (see FIG. 3B). To form the semiconductor laminate 180, a first conduction-type semiconductor layer 180a, an active layer 180b, and a second conduction-type semiconductor layer 180c are laminated in that order, starting from the first main surface 171W side of the wafer 170W. These semiconductor layers 180a, 180b, and 180c can be formed by an epitaxial growth method.

The wafer 170W and the semiconductor laminate 180 are then divided. This may be accomplished by laser scribing.

An example of laser scribing will be described through reference to the drawings.

Figure 3C:
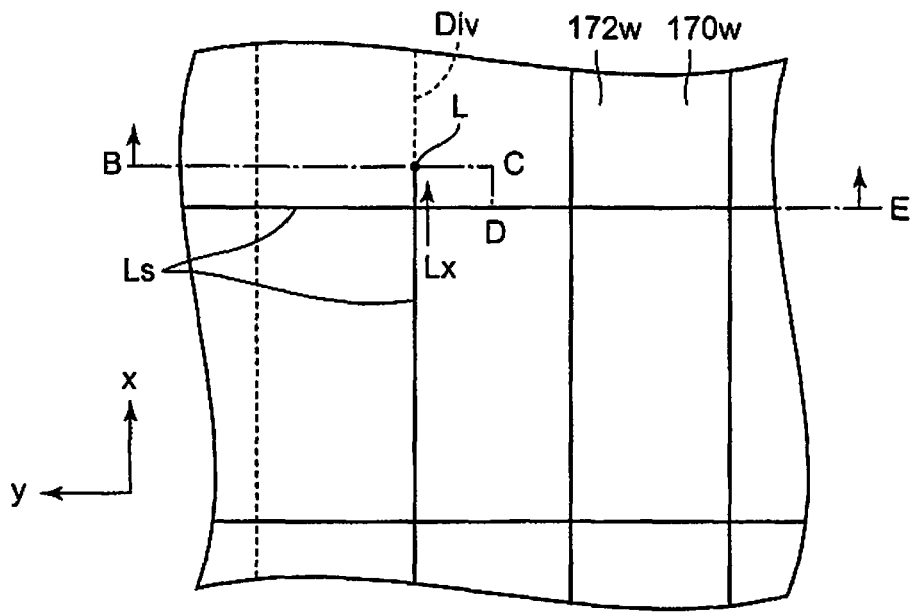

FIG. 3C is a simplified view of a second main surface 172W of the wafer 170W during laser scribing. The "dividing line Div" indicated by a broken line is the line where the wafer 170W is to be divided. The "laser scribing line Ls" indicated by a solid line is the scribing line upon completion of irradiation with a laser beam along the dividing line Div. A linear irradiation path (scribing line) is formed by moving the irradiation position of a laser beam L along the dividing line Div. In the example in FIG. 3C, the irradiation position of the laser beam L is moved in the x direction (the direction of the arrow Lx), along the dividing line Div that extends in the x direction.

Figure 3D:
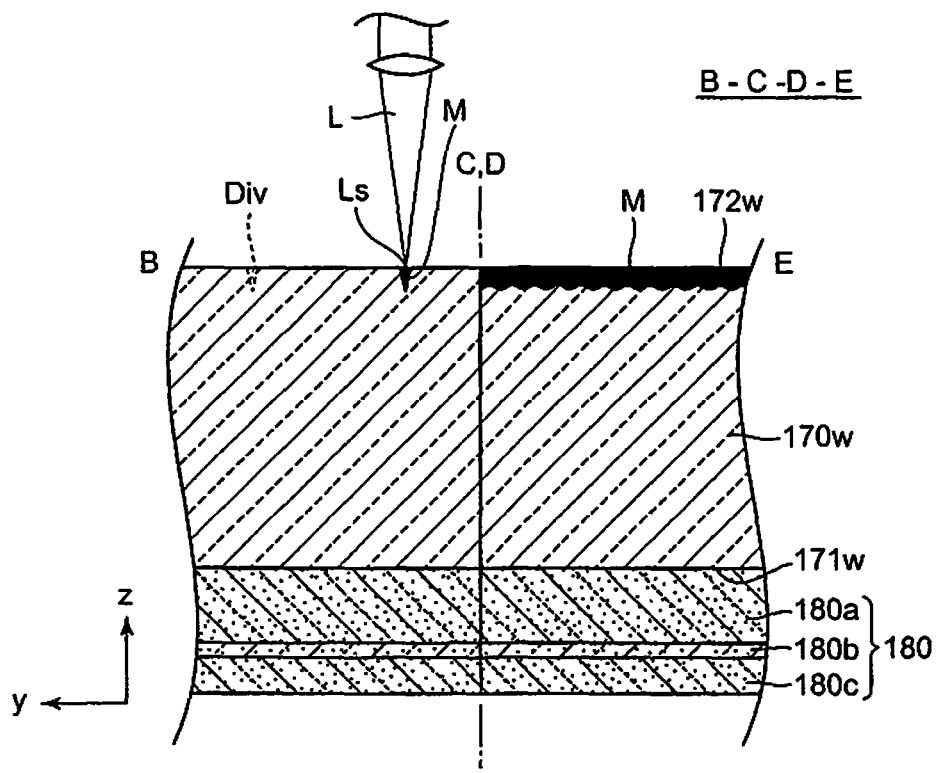
FIGS. 3D and 3E are schematic sectional views along the B-C-D-E line.

FIG. 3D is a cross section along the B-C-D-E line in FIG. 3C. The laser beam L is focused on the second main surface 172W of the wafer 170W. An altered part M is formed by irradiation with the laser beam L near the surface of the second main surface 172W. As shown in FIG. 3C, the B-C line intersects the laser scribing line Ls at just one place, so in the cross section between B-C in FIG. 3D, the altered part M is formed at just one place on the second main surface 172W. On the other hand, since the D-E line in FIG. 3C is superposed with the laser scribing line Ls, in the cross section between D-E in FIG. 3D, the altered part M is in the form of a band extending in the y direction.

Figure 3E:
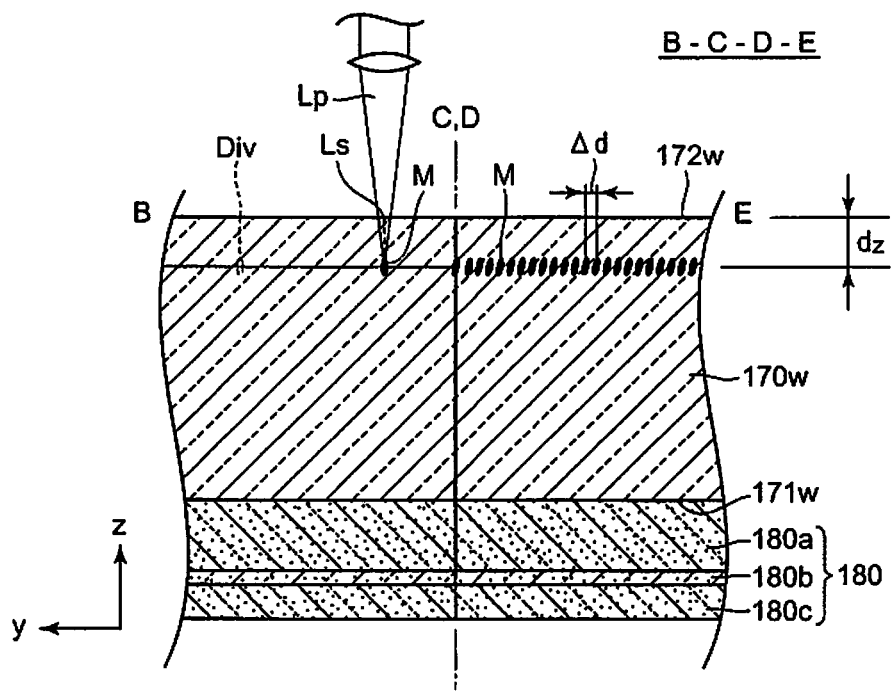

The position where the altered part M is formed is not limited to the second main surface 172W of the wafer 170W. Since the altered part M is formed at the focal position of the laser beam L, the altered part M can be formed in the inside of the wafer 170W if the focal position of the laser beam L is put in the inside of the wafer 170W. The altered part M here is preferably provided a specific distance away from the semiconductor layers 180a, 180b, and 180c to prevent damage to these semiconductor layers. FIG. 3E is similar to FIG. 3D in that it is a cross section along the B-C-D-E line in FIG. 3C. However, in FIG. 3E, in that the laser beam L is focused at a position that is a depth dz from the second main surface 172W of the wafer 170W. The altered part M is formed in the inside of the wafer 170W (near the depth dz from the second main surface 172W).

In FIG. 3E, a pulse laser Lp is used as the laser beam. When the pulse laser Lp is used, the altered part M is formed as a spot. When the pulse laser Lp is used, one or a few pulses of the pulse laser Lp are focused at the depth dz and at a specific position on the dividing line Div. This irradiation forms the altered part M as a single spot around the focal position. Then, the focal position of the laser beam is moved by a distance Δd along the dividing line Div (see FIG. 3C) without changing the depth dz. One or a few pulses of the pulse laser Lp are emitted at the focal position after this movement. This procedure is repeated to form a plurality of spots of the altered part M at the depth dz. The center positions of two adjacent spots of the altered part M are separated by the distance Δd (see the cross section between D-E in FIG. 3E).

In FIG. 3E, the cross section between B-C, just one spot of the method for manufacturing is formed at the depth dz. As shown in FIG. 3C, this is because the B-C line intersects the laser scribing line Ls at just one place. On the other hand, the D-E line in FIG. 3C is superposed with the laser scribing line Ls, so in the cross section between D-E in FIG. 3D, a plurality of spots of the method for manufacturing are formed, aligned in the y direction.

Figure 3F:
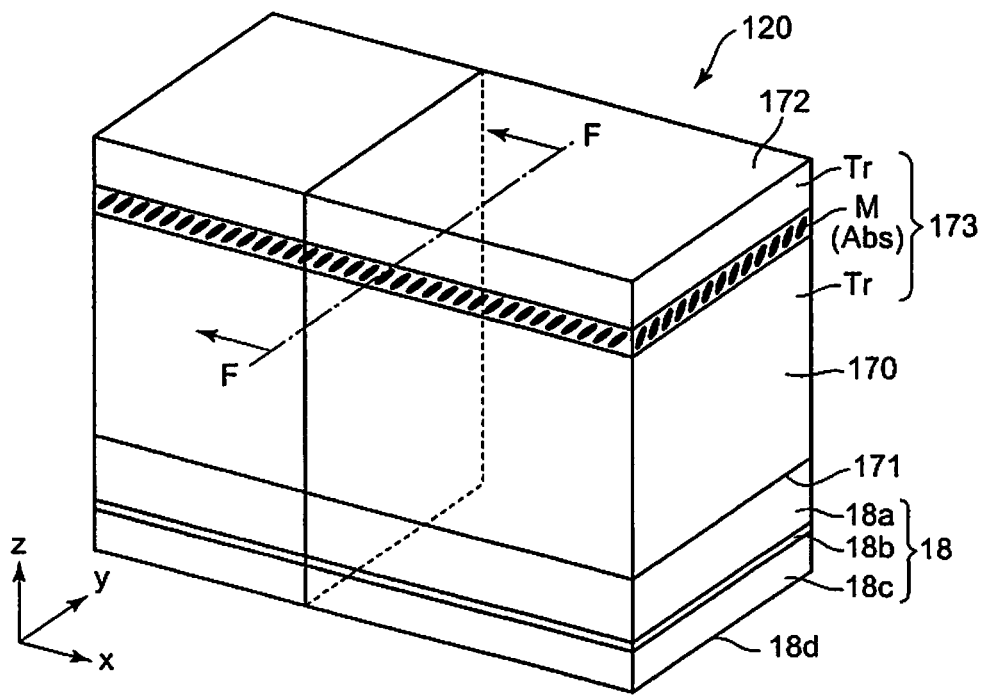

After the laser scribing line Ls is formed, the wafer 170W and the semiconductor laminate 180 are divided along this laser scribing line Ls. As a result, individual light emitting elements 120 are obtained (see FIG. 3F). FIG. 3F shows a light emitting element 120 that has been obtained by division with a laser scribing method that forms spots of the altered part M at the depth dz (see FIG. 3E). The light emitting element 120 includes a light transmissive substrate 170 split off from the wafer 170W, and a semiconductor laminate 18 split off from the semiconductor laminate 180. The light transmissive substrate 170 includes a first main surface 171, a second main surface 172, and a side surface 173. The side surface 173 has two light transmitting parts Tr and the altered part M in between them. The altered part M is also a "light absorbing part Abs" that has a lower optical transmissivity than the light transmitting parts Tr. This altered part M (light absorbing part Abs) is formed only on the surface of the side surface 173, and is not formed in the interior of the light transmissive substrate 170 (see FIG. 3G).

Figure 3G:
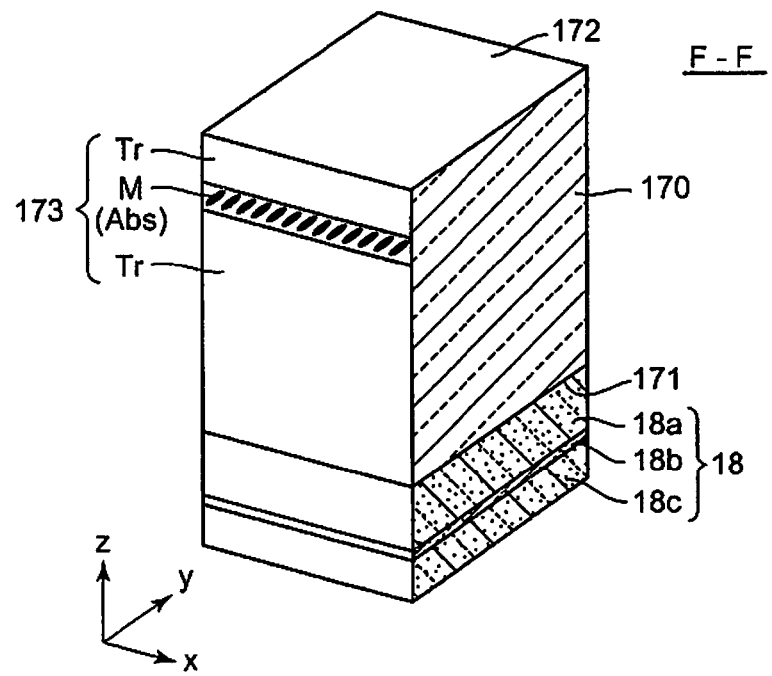
FIG. 3G is a schematic sectional view along the F-F line in FIG. 3C illustrating a method of a light emitting device of another embodiment of the present invention.

As shown in FIGS. 3F and 3G, the semiconductor laminate 18 is provided on the first main surface 171 of the light transmissive substrate 170. The semiconductor laminate 18 is produced by laminating a first conduction-type semiconductor layer 18a, an active layer 18b, and a second conduction-type semiconductor layer 18c in that order, starting from the first main surface 171 side.

Figure 3H:
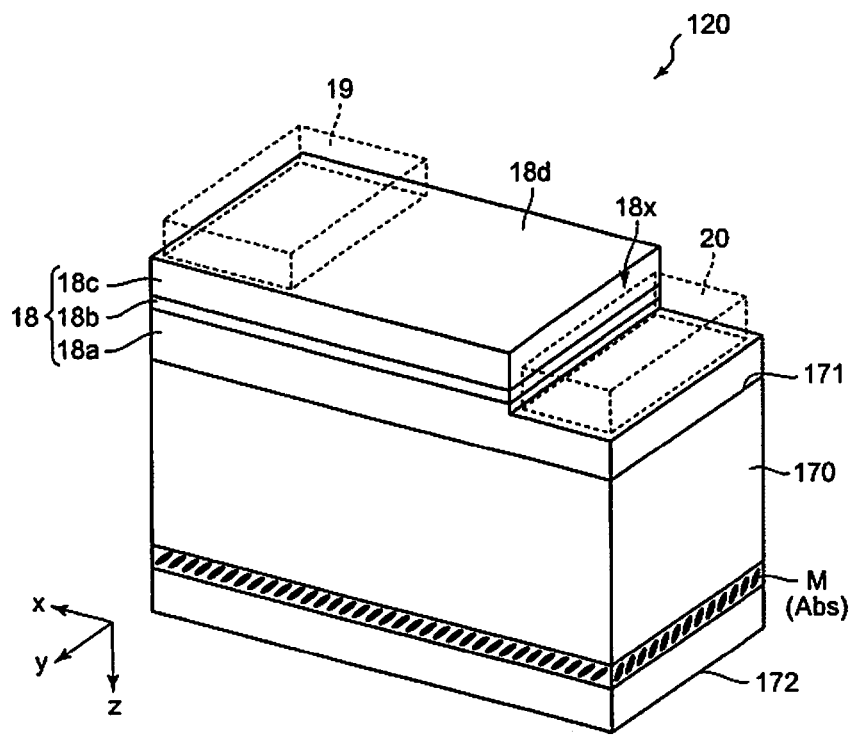

FIG. 3H shows the light emitting element 120 when it has been disposed so that its lower surface is facing up. In FIG. 3H, a surface 18d that faces the top of the semiconductor laminate 18 corresponds to the lower surface 18d of the semiconductor laminate 18 in FIG. 1B. Therefore, the surface 18d is also called the "lower surface 18d" in reference to FIG. 3H. A portion of the lower surface 18d of the semiconductor laminate 18 is removed by etching or the like to form a recessed portion (this will be called a cutout 18x). The depth of the cutout 18x (the dimension in the z direction) is at least greater than the combined thickness (the dimension in the z direction) of the active layer 18b and the second conduction-type semiconductor layer 18c, and is less than the thickness (the dimension in the z direction) of the semiconductor laminate 18. As a result, the first conduction-type semiconductor layer 18a is exposed from the lower surface of the cutout 18x.

After the cutout 18x has been formed, a pair of electrodes 19 and 20 is formed on the light emitting elements 120 (see FIG. 3H). The first electrode 19 is formed on the lower surface 18d of the semiconductor laminate 18 to electrically connect to the first conduction-type semiconductor layer 18a. The second electrode 20 is formed on the exposed portion of the second conduction-type semiconductor layer 18c, which is exposed in the cutout 18x, to electrically connect the second electrode 20 and the second conduction-type semiconductor layer 18c.

In FIG. 3H, the first electrode 19 is in direct contact with the first conduction-type semiconductor layer 18a, and the second electrode 20 is in direct contact with the second conduction-type semiconductor layer 18c, but this is not the only option. A conductive material may be disposed between the first electrode 19 and the first conduction-type semiconductor layer 18a, for example. As another example, an insulating film may be formed to cover from the side surface of the cutout 18x (with the active layer 18b and the second conduction-type semiconductor layer 18c exposed) to part of the lower surface 18d of the semiconductor laminate 18, and the second electrode 20 may be provided over this insulating film. The second electrode 20 and the second conduction-type semiconductor layer 18c can be electrically connected if the second electrode 20 is connected by metal wiring or the like to the exposed portion of the second conduction-type semiconductor layer 18c that is exposed in the cutout 18x.

Mounting of Light Emitting Element

The light emitting element is flip-chip-mounted on the base body. That is, the first electrode and the second electrode, which are disposed on the opposite surface to the substrate of the light emitting element, are bonded to the connection terminals of the base body.

For the bonding, any of the bonding members known in the art can be used, and examples include conductive bonding members. Specific examples include tin-bismuth-based solder, tin-copper-based solder, tin-silver-based solder, gold-silver-based solder and the like (specifically, alloys having Ag, Cu and Sn as main components, alloys having Cu and Sn as main components, alloys having Bi and Sn as main components, and the like), eutectic alloys (alloys having Au and Sn as main components, alloys having Au and Si as main components, alloys having Au and Ge as main components, and the like), conductive pastes of silver, gold, palladium and the like, bumps, anisotropic conductive materials, and brazing materials such as low-melting-point metals. For example, with the use of a solder a high-accuracy self-alignment effect can be exhibited. Accordingly, the light emitting element is easily mounted in the right place, so that mass productivity can be improved, and smaller light emitting devices can be produced.

The thickness of the bonding member is preferably about 2 to 50 μm, for example.

An example of a joining method is one in which a joining member and a melting auxiliary (flux) are disposed on the connection terminals of the base body, the light emitting element is disposed over this, and the material is heated to about 300° C. to reflow.

One light emitting element, or a plurality of light emitting elements may be mounted on one light emitting device. The size, shape and light emitting wavelength of the light emitting element can be appropriately selected. When a plurality of light emitting elements are mounted, they may be disposed irregularly, or may be disposed regularly in the form of a matrix or the like, or periodically. A plurality of light emitting elements may be connected in any form of series connection, parallel connection, series-parallel connection or parallel-series connection.

Sealing of Light Emitting Element

After the light emitting element has been mounted on the base body, it is covered with a sealing member (hereinafter also referred to as a support member).

The sealing member is a member having a function of sealing (covering) at least a part of the light emitting element or fixing the light emitting element to the base body. Examples of the material of the sealing member include ceramics, resins, dielectric materials, pulp, glass and composite materials thereof. Among those, resins are preferred because they can be easily molded into any shape.

Examples of the resin include thermosetting resins, thermoplastic resins, modified resins thereof and hybrid resins at least one of these resins. Specific examples include resins such as epoxy resin compositions, modified epoxy resin compositions (silicone-modified epoxy resins etc.), silicone resin compositions, modified silicone resin compositions (epoxy-modified silicone resins etc.), hybrid silicone resins, polyimide resin compositions, modified polyimide resin compositions, polyamide resins, polyethylene terephthalate resins, polybutylene terephthalate resins, polycyclohexane terephthalate resins, polyphthalamide (PPA), polycarbonate resins, polyphenylene sulfide (PPS), liquid crystal polymers (LCP), ABS resins, phenol resins, acrylic resins, PBT resins, urea resins, BT resins and polyurethane resins. In the case where the removal of the substrate and the sealing member (discussed below) is accomplished by polishing, it is preferable to use a thermosetting resin that will not readily be softened by the heat generated by the polishing. This makes it easier to remove the sealing member.

The sealing member may be light transmissive, but is more preferably a light shielding material having a reflectivity of 60% or more, 70% or more, 80% or more or 90% or more to light from the light emitting element. Thus, it is preferred that the above-described material, e.g. a resin contains, for example, a light reflection material, a light scattering material, a colorant and the like such as titanium dioxide, silicon dioxide, zirconium dioxide, potassium titanate, alumina, aluminum nitride, boron nitride, mullite, niobium oxide, zinc oxide, barium sulfate, carbon black and various kinds of rare earth oxides (e.g. yttrium oxide and gadolinium oxide).

The sealing member may contain a fibrous filler such as glass fibers or wollastonite, or an inorganic filler such as carbon. The sealing member may contain a material having high heat releasability (e.g. aluminum nitride etc.). Further, the sealing member may contain the later-described phosphor. Preferably, the sealing member contains these additives in an amount of, for example, about 10 to 95% by weight based on the total weight of the sealing member.

In the case where the sealing member contains a light reflection material, light from the light emitting element can be efficiently reflected. Particularly, by using a material having a light reflectivity higher than that of the base body (for example, by using a silicone resin containing titanium dioxide as a sealing member in the case of using aluminum nitride for the base body), light extraction efficiency of the light emitting device can be enhanced by reducing the size of the base body while handling characteristics are retained. When the light emitting device has a sealing member, the strength of the sealing member during a process such as removal or peeling of a growth substrate or a support of the semiconductor layer can be improved. Further, the strength of the whole light emitting device can be secured. By forming the sealing member from a material having high heat releasability, heat releasability of the light emitting device can be improved while the light emitting device is kept small.

The outer shape of the sealing member may be, for example, a cylindrical shape, a polygonal prism shape such as a quadrangular prism shape or a shape close thereto, a circular truncated cone shape, a polygonal truncated cone shape such as a quadrangular truncated cone shape, or a lens shape in part. Among those, the sealing member preferably has a shape that is narrow and long in the long direction of the base body. The sealing member preferably has a surface extending along the short direction of the base body.

The sealing member is preferably disposed in contact with a part or the whole of at least one side surface of the light emitting element so as to cover the side surface of the light emitting element, or preferably disposed in contact with the light emitting element so as to surround the entire periphery of the light emitting element. Covering the side surface of the semiconductor laminate of the light emitting element with the sealing member reduces the likelihood of damage to the semiconductor laminate during working of the substrate. Furthermore, if sealing member covers the entire side surface of the substrate of the light emitting element, the substrate will not be exposed at the outer peripheral edge that first comes into contact with the cutting tool or the like (the portion that is most susceptible to the impact of the cutting tool). As a result, chipping and the like are less likely to occur in the substrate during working.

Preferably, the sealing member is provided so as to fill a gap between the mounted light emitting element and the base body. The strength of the light emitting device can be accordingly enhanced. The sealing member disposed between the light emitting element and the base body may be a material different from the material covering the side surface of the light emitting element. Accordingly, suitable functions can be imparted to the sealing member disposed on the side surface of the light emitting element and the member disposed between the light emitting element and the base body. For example, a material having a high reflectivity can be used for the sealing member disposed on the side surface of the light emitting element, and a material for strengthening adhesion between the light emitting element and the base body can be used for the member disposed between the light emitting element and the base body.

The resin used in the sealing member preferably has the linear expansion coefficient of about 100 ppm/° C. or less, and the glass transition temperature of about 100° C. or lower. Accordingly, the possibility that the sealing member is peeled can be reduced even the base body is warped or distorted.

An edge of the sealing member in plan view (plan view as seen from the light extraction surface side) may be disposed on the inside or outside from an edge of the base body. In the case where the sealing member has a shape that is narrow and long in the long direction, one edge of the sealing member extending along the long direction preferably coincides with an edge of the base body extending along the long direction. That is, it is preferred that at least one of edges of the sealing member extending along the long direction forms the same plane with one of edges of the base body extending along the long direction, and it is more preferred that both edges of the sealing member form the same plane with both edges of the base body. Accordingly, the area of the light extraction surface can be increased, so that light extraction efficiency can be enhanced, without increasing the thickness of the light emitting device. An edge of the sealing member extending along the short direction is usually disposed on the inside from an edge of the base body extending along the short direction. The same plane herein not only means exactly the same, but also means that in the case where the sealing member is slightly R-shaped, a part of the R shape is coincides with the end surface of the base body.

The size of the sealing member is preferably larger than the light emitting element in terms of a plane area as seen from the light extraction surface side. Particularly, the length of the outermost shape of the sealing member in the long direction is preferably about 1.01 to 4.0 times of the length of one side of the light emitting element. Specifically, a length of about 100 to 1000 µm is preferred, and a length of about 200 to 800 µm is more preferred. The thickness of the sealing member (also referred to as a width from the end surface of the light emitting element to the outermost shape of the sealing member as seen from the light extraction surface side, or a minimum width of the sealing member at the side surface of the light emitting element) is, for example, about 1 to 100 µm, preferably about 5 to 80 µm or about 10 to 50 µm.

The upper surface of the sealing member may be at a height that completely covers the upper surface of the light emitting element (that is, the upper surface of the substrate), or may be substantially flush with the upper surface of the light emitting element. The sealing member may cover substantially the entire surface of the surface on the side of the base body where the light emitting element is mounted. That is, in plan view, the outer shape of the sealing member may be substantially the same as the outer shape of the base body. This affords a more compact light emitting device.

The sealing member may be formed by any method. In the case where the sealing member is made of the resin, the sealing member can be formed by screen printing, potting, transfer molding, a compression molding or the like. In the case where a molding machine is used, a mold release film may be used. In the case where the sealing member is made of thermosetting resin, a transfer molding is preferably used.

Removal of Sealing Member and Substrate

After the light emitting element has been covered by the sealing member, the substrate of the light emitting element is removed. The substrate may be removed entirely, or just part of it in the thickness direction.

At this point, the sealing member covering the light emitting element (more precisely, around the substrate) is also removed. The sealing member is preferably removed just part of it in the thickness direction. The substrate and the sealing member are preferably removed at the same time. The phrase "at the same time" here means that the substrate and the sealing member are both removed in a single removal operation.

The substrate and/or the sealing member is removed from the opposite side from the base body. This removal reduces the overall height/thickness of the resulting light emitting device itself, and allows a smaller and thinner light emitting device to be manufactured. Also, since the substrate is removed at the light extraction surface of the light emitting element, the absorption of light by the substrate can be avoided, and a light emitting device with even better light extraction efficiency can be manufactured. Meanwhile, in the removal of the substrate, since the light emitting element mounted on the base body is fixed and protected by the sealing member, the removal of the substrate and the sealing member can be carried out more accurately and efficiently.

For the removal method, and a variety of principles and methods can be employed, such as chemical or physical, wet or dry, and pressure transfer or momentum transfer. For example, chemical etching (e.g., wet etching or dry etching), polishing or grinding (using a lapping plate with free abrasive particles, a grinding disk with fixed abrasive particles, or the like), cutting, blasting, laser machining, surface planarization technique, or the like, or a combination of these may be used. Of these, a method in which a substrate and a sealing member with different materials, hardness, and so forth can be removed to substantially the same extent is preferable.

The polishing or grinding of the substrate may be done with either a wet or dry method, but when a wet method is used, this avoids the generation of heat during the polishing or grinding, and reduces the adhesion of polishing dust to unnecessary portions.

For example, laser liftoff, in which a laser beam is applied to between the substrate and the semiconductor laminate, may be used as a method for removing the substrate. More specifically, in the case where the semiconductor laminate is a GaN-based semiconductor, and the substrate is a sapphire substrate, a KrF excimer laser (wavelength of 248 nm), a YAG laser, or another such quadruple wave (266 nm) is applied form the substrate side, and the semiconductor layers constituting the semiconductor laminate absorb this energy and are ablated. This separates the substrate and removes substantially all of it. The amount of irradiation, the duration, and so forth of the laser beam can be suitably adjusted according to the type, thickness, and so forth of the substrate being used.

The laser irradiation range can be about 1 to 50 µm, or 20 to 30 µm, larger than the outer shape of the upper surface of the light emitting element from which the substrate is removed. In the case where laser liftoff is used, it is preferable to use zirconium oxide, yttrium oxide, or the like for the light reflection material contained in the sealing member.

The substrate is preferably removed so that the thickness will be about 1 to 100 µm, and more preferably about 1 µm to 50 µm. Producing a thin film such as this allows the light extraction efficiency to be further enhanced. Meanwhile, since the step of removing the substrate is performed after mounting on the base and after covering with the sealing member, splitting, chipping, warping, and so on of the light emitting element, and particularly the semiconductor laminate, due to making the substrate into a thin film can be reduced, resulting in extremely good productivity. Not removing all of the substrate raises the light extraction efficiency, while also ensuring that the light emitting element will still have the required strength.

The removal surface of the sealing member is preferably flush with the removal surface of the substrate. The term "flush" here means that variance of about ±5 µm is allowed. The removal surface of the sealing member may be higher than the substrate removal surface of the light emitting element, but is preferably lower.

The removal surfaces of the sealing member and the substrate are preferably flat. The term "flat" here means that the surface roughness Ra is low, an example of which is about 1 µm or less, or preferably about 500 nm or less. Having the surfaces be this flat reduces unwanted scattering of the light emitted from the light emitting element. As a result, there is less scattering of light within the substrate, and the light extraction to the upper surface side of the light emitting device can be improved.

Furthermore, it is preferable when there is a step of surface treatment after the removal of the sealing member and the substrate. For example, the upper surface of the substrate may be processed so that in plan view it has texturing in the form of multiple lines or a lattice, texturing in the form of multiple polyhedral shapes, a lens shape, or the like. This can improve the light extraction efficiency from the substrate.

This surface treatment can be performed, for example, by etching, blasting, laser working, or the like.

In the case where the surface of the sealing member or the substrate (if the substrate is completely removed, then the semiconductor laminate) is etched with HCl, $HNO_3$, or another such acid, NaOH, TMAH, or another such strong alkali, or the like, or a liquid that is a combination of these, then any debris or the like remaining on the surface of the substrate or the sealing member can be effectively removed.

There is the risk of degrading the sealing member in this surface treatment, so preferably just the surface of the substrate is processed. A laser can be utilized for this surface treatment.

After the substrate and the sealing member have been removed, additional working may be performed as needed. For instance, burrs produced in the removal of the sealing member may be removed, or, if the sealing member has been degrading in the course of the above-mentioned surface treatment of the substrate, laser liftoff, or the like, this altered part may be removed.

Formation of Light Transmissive Member

After the substrate and the sealing member have been removed, a light transmissive member may be formed on the substrate or on both the substrate and the sealing member, that is, on the light extraction surface of the light emitting device. This effectively protects the light emitting element, whose strength is diminished after the substrate is removed.

In the case where the light emitting element has been covered by an opaque sealing member, the light transmissive member preferably covers the upper surface of the sealing member. The end surfaces of the light transmissive member may be covered with a sealing member, but need not be covered.

The light transmissive member is preferably one permeable to 60% or more, further preferably 70%, 80% or 90% or more of light emitted from the light emitting layer. The light transmissive member may be a member similar to the sealing member, or may be a member different from the sealing member. Examples include resins such as silicone resins, silicone modified resins, epoxy resins, epoxy modified resins, phenol resins, polycarbonate resins, acrylic resins, TPX resins, polynorbornene resins, and hybrid resins containing at least one of these resins, and glass. Among those, silicone resins or epoxy resins are preferred, and silicone resins having goodlight resistance and heat resistance are more preferred.

The light transmissive member is preferably one containing a phosphor that is excited by light from the light emitting element. As the phosphor, one known in the art can be used. Examples include yttrium-aluminum-garnet (YAG)-based phosphors activated by cerium, lutetium-aluminum-garnet (LAG)-based phosphors activated by cerium, nitrogen-containing calcium aluminosilicate ($CaO—Al_2O_3—SiO_2$)-based phosphors activated by europium and/or chromium, silicate (($Sr, Ba)_2SiO_4$)-based phosphors activated by europium, β-sialon phosphors, nitride-based phosphors such as CASN-based or SCASN-based phosphors, KSF-based phosphors ($K_2SiF_6$:Mn) and sulfide-based phosphors. Accordingly, there can be provided a light emitting device that emits mixed-color light (e.g. white light) of primary light having a visible wavelength and secondary light having a visible wavelength, and a light emitting device that is excited by primary light having ultraviolet light to emit secondary light having a visible wavelength.

For example, the phosphor is preferably one having an average particle size of 30 μm or less. The average particle size can be measured and calculated using a commercially available particle measurement device, a particle size distribution measurement device, or the like. The phosphor may be a luminescent material referred to as a so called nanocrystal or quantum dot.

The phosphor is not necessarily contained in the above-mentioned member, but may be provided at various positions (e.g., away from the light emitting device) or other members in the light emitting device.

The light transmissive member may contain a filler (e.g. a diffusing agent, a colorant or the like). Examples include silica, titanium oxide, zirconium oxide, magnesium oxide, glass, a crystal or sintered body of a phosphor, and a sintered body of a phosphor and an inorganic binding material. Optionally, the refractive index of the filler may be adjusted. The refractive index is, for example, 1.8 or more.

The amount of the phosphor and/or the filler is, for example, preferably about 10 to 80% by weight based on the total weight of the light transmissive member.

Examples of the method for forming a light transmissive member include a method in which a light transmissive member is molded in the form of a sheet, and bonded by a hot melt method or by an adhesive, a method in which a phosphor is deposited by an electrophoretic deposition method, and then impregnated with a light transmissive resin, a potting, a transfer molding or compression molding, molding with using casting cases, a spraying method, an electrostatic coating method and a printing method.

Among those, a spraying method, particularly a pulse spraying method of injecting spray pulsewise, i.e. intermittently is preferred in the case where a phosphor is included in the light transmissive member. Accordingly, deviation of the distribution of the phosphor can be suppressed, light subjected to uniform wavelength conversion can be emitted, and occurrence of color irregularity etc. of the light emitting element can be avoided.

The thickness of the light transmissive member is not particularly limited, and is, for example, about 1 to 300 μm, preferably about 1 to 100 μm, more preferably about 5 to 100 μm, about 2 to 60 μm or about 5 to 40 μm.

Figure 5A:
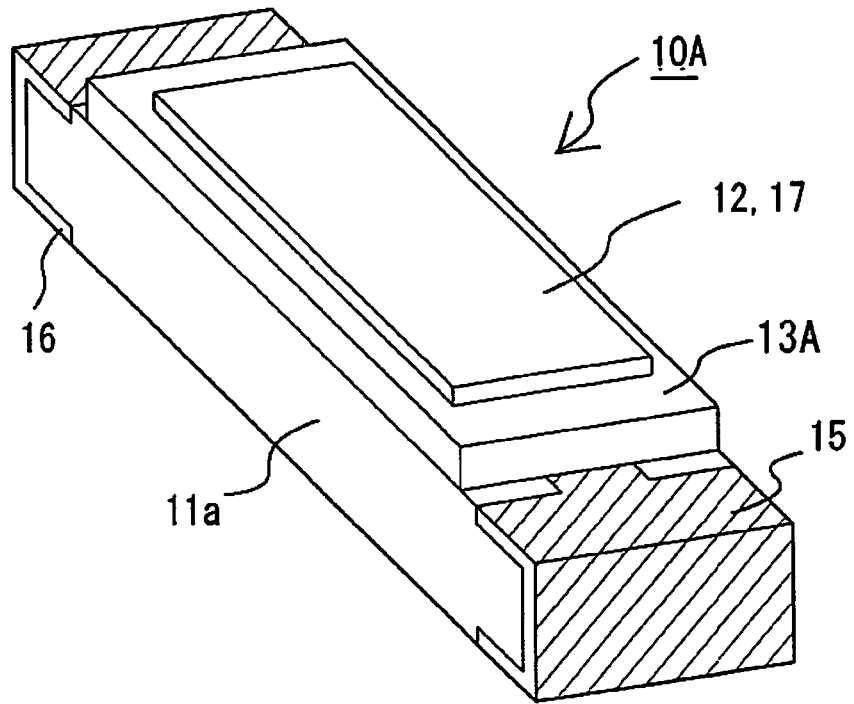
FIGS. 5A and 5B are diagrammatic perspective views illustrating another light emitting device manufactured by a method of an embodiment of the present invention, respectively.
Figure 5B:
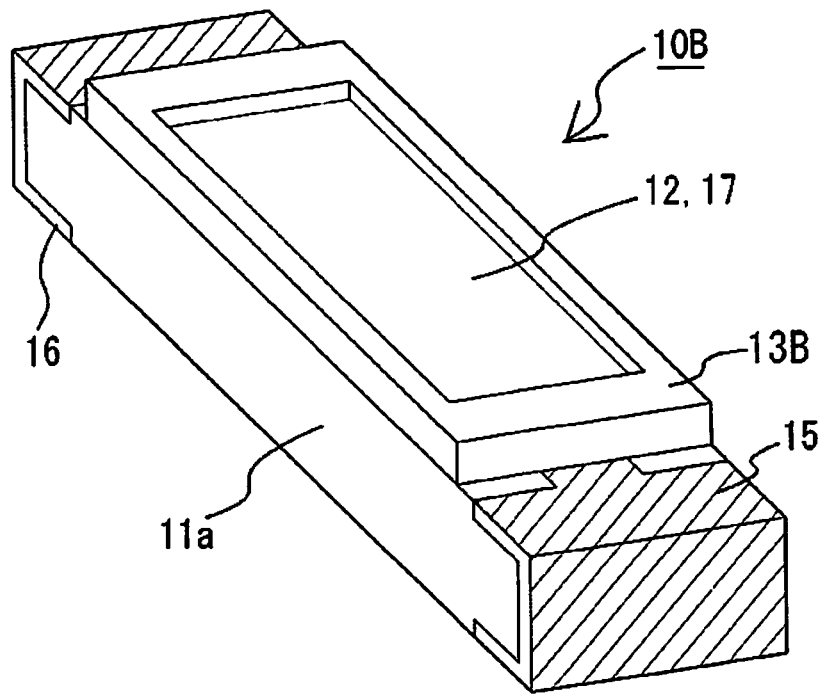

The surface of the light transmissive member may be flat, but there may also have bumps, recesses, or the like on the upper surface for a variety of purposes. For instance, as shown in FIGS. 5A and 5B, in the case where the upper surface of the substrate 17 is not flush with upper surfaces of the sealing members 13A and 13B after removal (when there is a step between them), then the upper surface of the light transmissive member may also have a step corresponding to this step. This improves the adhesion of the light transmissive member to the light emitting element and the sealing member because the contact surface area of the light transmissive member to these is increased. In particular, if the upper surface of the sealing member is lower than the upper surface of the substrate, then the upper surface of the light transmissive member above the sealing member will be lower than the upper surface of the light transmissive member above the light emitting element. Consequently, the light transmissive member can also cover the side surface of the substrate exposed from the sealing member, so adhesion of the light transmissive member to the light emitting element can be better ensured. In the case where the light transmissive member is provided in a substantially uniform thickness over the sealing member and the light emitting element in a state in which the upper surface of the light emitting element sticks out beyond the sealing member, there will be less difference in the distance (optical path length) over which light emitted from the side surface and from the exposed upper surface of the light emitting element is transmitted through the light transmissive member. That is, in the case where the light transmissive member contains a phosphor, there will be less light distribution color unevenness in the light emitting device.

The light transmissive member may be provided, for example, by bonding or fixing glass, ceramic, or another such hard light transmissive member. This further raises the strength of the light emitting device, which makes it easier to handle. Even in the case where using a light emitting element whose thickness has been reduced by the removal of the substrate, it will be resistant to damage and reliability and the like will be enhanced.

The method for manufacturing a light emitting device discussed above can be applied not only to a method for manufacturing a single light emitting device, but also the manufacture of a plurality of light emitting devices at once, which are ultimately separated into individual light emitting devices. That is, a plurality of light emitting elements are prepared, these light emitting elements are joined to a plurality of connection terminals of a composite base body to which a plurality of base bodies are linked, the light emitting elements are integrally covered with a sealing member, this sealing member and the substrates of the light emitting elements are removed, and the sealing member and the base bodies are divided to manufacture a plurality of light emitting devices.

The division of the sealing member and the base bodies can be accomplished, for example, by division/machining using a blade, a laser, etc., or any other method known in this field.

Production efficiency can be improved by using a composite base body to manufacture the light emitting devices. For example, the efficiency of the removal step can be increased by mounting a plurality of light emitting devices on a composite base body, then remove the substrates and the sealing member prior to dividing the base body into the individual light emitting devices. It is preferable if the removal step is performed using a composite base body that is larger than the smaller base bodies after division, because the sealing member can be removed more stably (particularly in the case of polishing, grinding, blast, etc.).

The sealing member and the substrates of the light emitting elements may also be removed after the base bodies on which the light emitting elements are mounted have been integrally linked with a sealing member. This has the same effect as in the case of using a composite base body.

The light emitting device obtained with the above-mentioned manufacturing method includes, for example, by a base body comprising a pair of connection terminals, a light emitting element, and a sealing member that covers the side surface of the light emitting element. The light emitting element includes a substrate, a semiconductor laminate that is laminated on this substrate, and a pair of electrodes formed on the surface of this semiconductor laminate. The substrate of the light emitting element has a thickness of no more than 50 µm, for example, so the light extraction efficiency is high. The surfaces on the upper surface side (the light extraction surface side) of the sealing member and the substrate of the light emitting element are formed flush. Alternatively, the upper surface of the substrate of the light emitting element is disposed at a position that is either higher or lower than the upper surface of the sealing member. This height difference is preferably within about 5 µm, for example.

When the sealing member and the substrate of the light emitting element are removed, the distance is short between the upper surface of the light emitting device and the light emitting layer of the light emitting element. In the case where a light emitting device such as this is used as a side view type of light emitting device, the distance between alight entering surface of a light guide plate, which receives light from the light emitting device and the light emitting layer of the light emitting element can be made short. This allows the light to be brought into the light guide more efficiently.

Hereinafter, embodiments of the method for manufacturing the light emitting device of the present invention will be described with reference to the drawings.

Embodiment 1

As shown in FIGS. 1A and 1B, the light emitting device 10 manufactured in this embodiment includes a base body 11, a light emitting element 12, and a sealing member 13. This light emitting device 10 also includes a light transmissive member 14 that covers the light emitting element 12 and the sealing member 13.

The base body 11 includes a pair of connection terminals 15 and 16 that extend from the upper surface of a base material 11a, through the end surface, to the lower surface. The base material 11a is composed of a BT resin composition containing a naphthalene-based epoxy resin that contains a commercial glass cloth. The connection terminals 15 and 16 are produced, for example, by laminating copper, nickel, and gold (total thickness: 20 µm), starting from the base material 11a side.

Figure 1C:
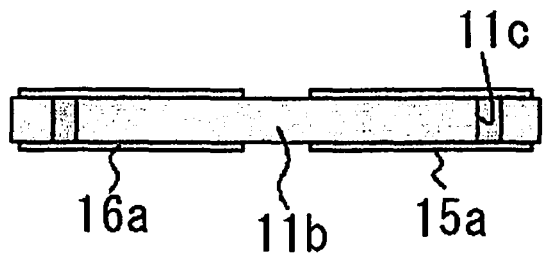
FIG. 1C is a schematic longitudinal sectional view illustrating a base body using another method for manufacturing a light emitting device of another embodiment of the present invention.

As shown in FIG. 1C, the base body may be such that connection terminals 15a and 16a extend from the upper surface to the lower surface, through a via hole 11c formed in the base material 11b. In this case, the base body can be formed by forming the base material 11a as a flat, rectangular piece of insulating material, passing it through two via holes 11c, filling the via holes 11c with a conductive material, forming a metal film on the upper and lower surfaces of the base material 11a so as to cover the via holes 11c and be in contact with the conductive material in the via holes 11c, and forming the connection terminals 15s and 16a from the metal film and the conductive material in the via holes 11c.

The light emitting element 12 has a semiconductor laminate (thickness: about 8 to 12 µm) formed on a sapphire substrate (thickness: about 50 µm), and includes a pair of positive and negative electrodes on a surface opposite to the sapphire substrate of the semiconductor laminate. In the light emitting element 12, each of the pair of positive and negative electrodes is connected to a pair of connection terminals 15, 16 of the base body 11 by a meltable bonding member 21 (thickness: 20 µm) that is Au—Sn eutectic solder.

The light emitting element 12 is substantially a rectangular parallelepiped-shaped LED chip which has a length of 1100 µm in the long direction, a width of 230 µm in the short direction and a thickness of 100 µm and emits blue light (light emission peak wavelength: 455 nm).

The sealing member 13 is formed in substantially a rectangular parallelepiped shape having a length (full length) of 1.2 mm in the long direction, a width (full length) of 0.3 mm in the short direction and a thickness of 0.15 mm. Edges of the sealing member 13 extending along the long direction coincides with edges of the base body 11 extending along the long direction. The end surface in the long direction of the sealing member 13 is formed flush with the end surface in the long direction of the base body 11.

The sealing member 13 is provided on the first main surface of the base body 11 such that the sealing member 13a covers the whole circumference of the side surface of the light emitting element 12 in contact therewith. The sealing member 13b is also provided integrally with the seaming member 13a on a surface of the light emitting element 12 opposite to the base body 11. Accordingly, light can be efficiently extracted from the light emitting element 12 to the upper surface. By depositing the sealing member 13, the light emitting element 12 can be more strongly connected to the base body 11. The upper surface of the sealing member 13 substantially coincides with the upper surface of the light emitting element 12.

The sealing member 13 is formed of a silicone resin containing silica having an average particle size of 14 µm and titanium oxide having an average particle size of 0.25 to 0.3 µm as inorganic particles in amounts of 2 to 2.5 wt % and 40 to 50 wt %, respectively, based on the total weight of the sealing member 13.

The light transmissive member 14 (thickness: 20 µm) is disposed on a surface on a side opposite to a pair of positive and negative electrodes 19, 20 of the light emitting element 12. The light transmissive member 14 is formed by silicone resin containing a phosphor of YAG:Ce.

The light transmissive member 14 covers the upper surface of the sealing member 13. The end surfaces of the light transmissive member 14 coincide with the end surface of the sealing member 14.

This light emitting device can be manufactured by the following method.

Figure 2A:
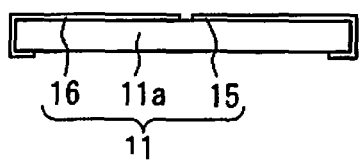
FIGS. 2A to 2F are schematic sectional views for illustrating a method of a light emitting device of an embodiment of the present invention.
Figure 2B:
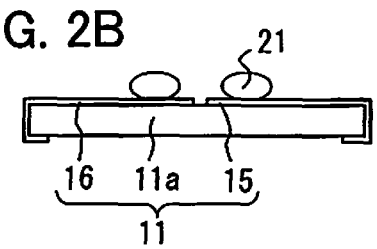

First, as shown in FIG. 2A, the above-mentioned base body 11 equipped with a pair of connection terminals 15 and 16 is prepared. As shown in FIG. 2B, solder bumps of the joining members 21 for joining the electrodes of the light emitting element on the connection terminals 15 and 16 is formed on the base body 11.

Figure 2C:
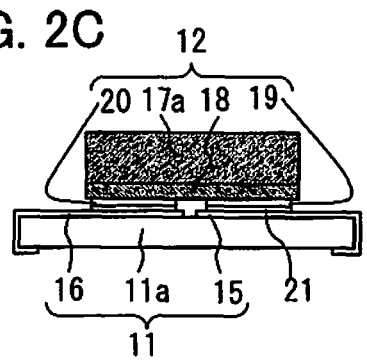

Next, the above-mentioned light emitting element 12 is prepared, which includes the semiconductor laminate 18 on the substrate 17, and the pair of electrodes 19 and 20 formed on the surface of this semiconductor laminate 18. As shown in FIG. 2C, the electrodes 19 and 20 of the light emitting element 12 are then disposed with flip-chip manner so as to be opposite the joining members 21 on the connection terminals 15 and 16, this is heated at 250° C. to reflow the joining members 21, and this is allowed to cool to join the light emitting element on the base body 11.

Figure 2D:
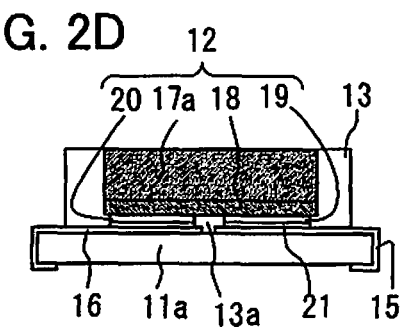

After this, as shown in FIG. 2D, the light emitting element 12 is covered with the sealing member 13. The covering by the sealing member 13 here can be accomplished by transfer molding. This molding method allows the sealing member 13a, 13b to be disposed not only on the side surface of the light emitting element 12, but also between the light emitting element 12 and the base body 11.

Figure 2E:
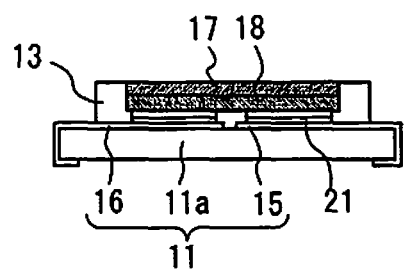

As shown in FIG. 2E, the sealing member 13 and the substrate 17 of the light emitting element 12 are then removed from the surface on the opposite side from the base body 11 side of the light emitting element 12. This removal is accomplished, for example, by using a grinder. A wheel formed from a material harder than the substrate 17 is used as the grinding stone, and the working rate is set to about 0.05 to 5 μm/second. The grinding stone and the stage may rotate in the same direction or in opposite directions. Thus, the sealing member 13 and the substrate 17 are removed at the same time so that the sealing member 13 is flush with the substrate 17 of the light emitting element 12, until the thickness of the substrate 17 reaches 50 μm.

More specifically, the wheel can be one to which a material (particles, a powder, etc.) harder than the substrate has been fixed with a resin or the like. Examples of materials that are harder than the substrate include alumina, silicon carbide, and natural or manmade diamond. Of these, the use of diamond is preferable in the case where the substrate is sapphire.

After this, the surface from which the substrate 17 has been removed is subjected to a surface treatment. For example, the upper surface of the substrate 17 may be processed so that in top view it has grooves or ridges in the form of lines or a lattice, or may be processed into a lens shape. Known methods and conditions can be suitably set in this surface treatment. The use of a laser is especially preferable because it reduces degradation of the sealing member 13. Since a laser allows a narrower processing range to be selected, just the upper surface of the substrate 17 can be processed.

Figure 2F:
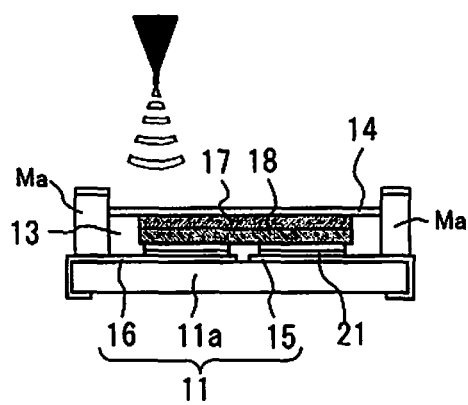

Then, as shown in FIG. 2F, a mask Ma that surrounds the sealing member 13 is used to cover the surface of the substrate 17 of the light emitting element 12 and the sealing member 13 with the light transmissive member 14 by pulse spraying.

The light transmissive member 14 may be formed on just the upper surface of the substrate 17 of the light emitting element 12. A flat light transmissive member having substantially the same shape as the light emitting element 12, or both the light emitting element 12 and the sealing member 13, may be bonded to the upper surface of the light emitting element.

Finally, the mask Ma is removed to complete the light emitting device.

MODIFICATION EXAMPLE 1

In Embodiment 1, as discussed above, the light emitting element 120 including the light transmissive substrate 170, the semiconductor laminate 18 disposed on the first main surface 171 of the light transmissive substrate 170, and the pair of electrodes 19 and 20 disposed on the lower surface 18d of the semiconductor laminate 18 was prepared (FIGS. 1B and 3H), and other than using this light emitting element, a light emitting device is manufactured in the same manner as in Embodiment 1.

An altered part M (light absorbing part Abs) produced by laser scribing is formed on the side surface 173 of the light transmissive substrate 170. In FIG. 3F, the dimensions in the z direction are approximately 125 μm for the light transmissive substrate 170, approximately 80 μm for the light transmitting part Tr on the first main surface 171 side, approximately 24 μm for the an altered part M, and 21 μm for the light transmitting part Tr on the second main surface 172 side.

MODIFICATION EXAMPLE 2

This is substantially the same as Embodiment 1, except that the base 11 is formed, a light emitting element is installed, a sealing member is formed, and the substrate of the light emitting element is made into a thin film, as follows.

Figure 4A:
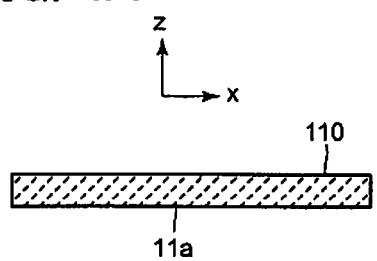
FIGS. 4A to 4F are schematic sectional views for illustrating a method of a light emitting device of still another embodiment of the present invention.

First, an insulating base material 11a is prepared. As shown in FIG. 4A, the base material 11a is an insulating material (such as a ceramic or a resin) that has been molded into a rectangular, flat member.

In the manufacture of a base material 11a made of resin, a thermosetting resin may be formed in a mold, etc., or a resin block may be mechanical worked.

In the case where the base material 11a is formed from a ceramic material, it is preferable to mold a green sheet, print the surface of the green sheet with a metal film for forming the connection terminals 15 and 16, and sinter this. This improves the joining strength between the base material 11a (ceramic material) and the connection terminals 15 and 16. Also, the base material 11a can be formed from a conductive member covered with an insulating material. For example, a rectangular metal plate can be readied, its surface covered with an insulating film such as an alumina film, and this product used as the base material 11a.

Figure 4D:
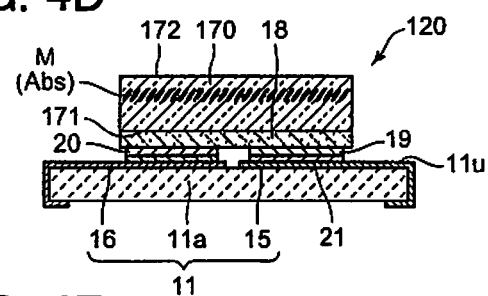
Figure 4B:
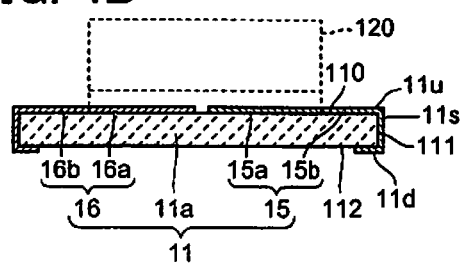

Connection terminals 15 and 16 composed of a metal film of the desired shape are provided to the surface of the base material 11a (see FIG. 4B). As shown in FIGS. 1B and 4B, the connection terminals 15 and 16 can include element connection sections 15a and 16a and external connection sections 15b and 16b. The element connection sections 15a and 16a are used to connect to electrodes 19 and 20 of light emitting elements 12 and 120. In plan view, when the light emitting elements 12 and 120 have been mounted, the element connection sections 15a and 16a are covered by the light emitting elements 12 and 120 (see FIG. 1B). The element connection sections 15a and 16a are connected to the external connection sections 15b and 16b.

The element connection sections 15a and 16a are electrically connected to external electrodes via the external connection sections 15b and 16b. In other words, the external connection sections 15b and 16b is connected to external electrodes when the light emitting elements 12 and 120 are mounted. Therefore, the external connection sections 15b and 16b are formed at positions that are not covered by the light emitting elements 12 and 120 or a support member 13 when the light emitting elements 12 and 120 are mounted. For example, in FIG. 1B, the external connection section 15b of the connection terminal 15 extends from the element connection section 15a in the −x direction farther to the outside than the light emitting element 12. The external connection section 16b of the connection terminal 16 extends from the element connection section 16a in the x direction farther to the outside than the light emitting element 12.

The external connection sections 15b and 16b need not have a uniform width (the dimension in the y direction). The external connection sections 15b and 16b shown in FIG. 1B include a narrow portion that is narrower in width than the element connection sections 15a and 16a and is connected to the element connection sections 15a and 16a, and a wide portion that is wider than the narrow portion and the element connection sections 15a and 16a and is connected to the narrow portion. As shown in FIGS. 1A and 1B, the narrow portion is disposed so that the outer surface of the support member 13 traverses the narrow portion.

As shown in FIGS. 1B and 4B, the external connection sections 15b and 16b may extend from the upper surface 11u of the base 11, through the side surface 11s, to the lower surface 11d.

Figure 4E:
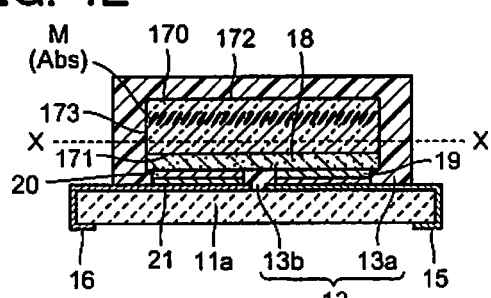
Figure 4C:
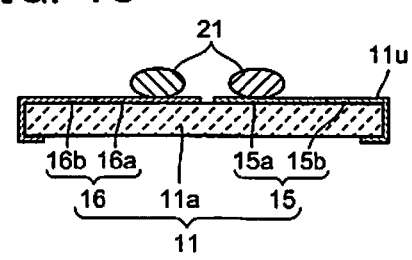

As in Embodiment 1, the light emitting element 120 is joined to the base 11 prepared by the above method (see FIG. 4C).

The light emitting element 120 is disposed so that the side on which a semiconductor laminate 18 is provided (that is, the lower surface 18d side of the semiconductor laminate 18) faces down. The lower surface 18d side of the semiconductor laminate 18 is then disposed opposite the upper surface 11u of the base 11. The electrodes 19 and 20 provided on the lower surface 18d side of the semiconductor laminate 18 are brought into contact with a joining member 21 applied by providing the element connection sections 15a and 16a of the connection terminals 15 and 16 of the base 11.

In the case where a conductive paste is used as the joining member 21, the second main surface 172 of a light transmissive substrate 170 of the light emitting element 120 may be lightly pressed. Then, the joining member 21 spreads out evenly between the electrodes 19 and 20 of the light emitting element 120 and the connection terminals 15 and 16 of the base 11. On the other hand, in the case where solder or another such material that is capable of reflow is used as the joining member 21, the base 11 may be placed in a reflow furnace while the light emitting element 120 is without pressing. Such joining member 21 can melt and spreads out evenly between the electrodes 19 and 20 of the light emitting element 120 and the connection terminals 15 and 16 of the base 11. Upon being removed from the reflow furnace, the joining member 21 is cooled and solidified. Consequently, the light emitting element 120 is flip-chip mounted to the base 11 by the joining member 21 (see FIG. 4D). In the flip-chip mounting of the light emitting element 120 to the base 11, the thickness of the joining member 21 (the dimension in the z direction) is preferably about 2 to 50 μm.

As shown in FIG. 4E, after the light emitting element 120 has been joined to the base 11, the support member 13 is provided to cover the light emitting element 120 and the base 11. The support member 13 is preferably formed from an insulating material. This helps avoid short circuiting even if the support member 13 comes into contact with the side surface of the semiconductor laminate 18 of the light emitting element 120. Examples of insulating materials that are suitable for the support member 13 include resin, glass, and combinations of these. A resin material is particularly favorable because of its good moldability and mechanical workability. The support member 13 can be formed by a known or above mentioned method.

The support member 13 can include a first portion 13a and a second portion 13b. The first portion 13a covers part of at least one side surface 173 of the light transmissive substrate 170 of the light emitting element 120. The support member 13 preferably covers at least part of all the side surfaces 173 of the light emitting element 120, and it is particularly favorable for it to cover the entirety of all of the side surfaces 173. The second portion 13b of the support member 13 fills in the gap between the light emitting element 120 and the base 11. Just the first portion 13a may be formed as the support member 13, but it is preferable to form both portions, as this improves how well the support member 13 holds the light emitting element 120. The first portion 13a and the second portion 13b may be formed from the same material. This allows the first portion 13a and the second portion 13b to be formed at the same time. On the other hand, the first portion 13a and the second portion 13b may be formed from different materials, and different functions can be assigned to the first portion 13a and the second portion 13b. For instance, the first portion 13a may be formed from a material with a high reflectivity, and the second portion 13b may be formed from a material with high joining strength.

In FIG. 4E, the support member 13 covers part of the upper surface 11u of the base 11, but this is not the only option, and the support member 13 may instead cover substantially the entire upper surface 11u of the base 11. That is, in plan view, the outer shape of the first portion 13a may be substantially the same as the outer shape of the base 11. As shown in FIG. 4E, the support member 13 may cover the second main surface 172 of the light transmissive substrate 170.

After the light emitting element 120 has been covered by the support member 13, the light transmissive substrate 170 of the light emitting element 12 is thinned from the second main surface 172 side that is opposite the first main surface 171. In FIG. 4E, the second main surface 172 is covered by the support member 13. Thus, the light transmissive substrate 170 is further thinned after the support member 13 has been removed from the second main surface 172. The light transmissive substrate 17 after this thinning is numbered 17 in the drawings. The light emitting element equipped with the thinned light transmissive substrate 17 is numbered 12.

The light transmissive substrate 170 is preferably thinned until an altered part M of its side surface 173 (that is, a light absorption part Abs) is completely removed. For example, the light transmissive substrate 170 is thinned to the X-X line in FIG. 4E. Since removal of the light absorption part Abs prevents light from being absorbed by the light absorption part Abs, the light takeoff efficiency of the light emitting element 12 is improved. Also, since the overall thickness of the light emitting element 12 is reduced, the light emitting device 10 can be made thinner.

The thickness of the light transmissive substrate 170 prior to removing is 110 to 500 μm, for example.

The thinning of the light transmissive substrate 170 can be accomplished by the same removal method as what described above.

As shown in FIG. 4E, the light transmissive substrate 170 is thinned after the light emitting element 120 is supported by the support member 13 on the base 11. As a result, it is less likely that the light emitting element 120 will be damaged or separate from the base 11 when the light emitting element 120 is subjected to a force in the lateral direction (the x direction in FIG. 3E) from a grinding wheel or other such tool. Also, the gap between the light emitting element 120 and the base 11 may be filled in by the second portion 13b of the support member 13. The second portion 13b supports the light emitting element 120 when the light emitting element 120 is subjected to a downward force (the −z direction in FIG. 3E) by a tool. As a result, damage to the light emitting element 120 can be reduced.

Figure 4F:
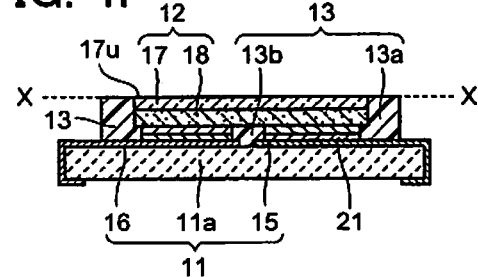

In the case where all of the side surfaces 173 of the light transmissive substrate 170 of the light emitting element 120 are covered by the first portion 13a of the support member 13, then the first portion 13a will also be thinned when the light transmissive substrate 170 is thinned. Polishing, grinding, cutting, and other such mechanical working make the worked surfaces substantially flush (the plane located on the X-X line in FIG. 4F). In other words, as shown in FIG. 1B, the upper surface of the light transmissive substrate 170 is substantially flush with the upper surface 13*u* of the first portion 13*a*.

After this, as shown in FIG. 3G, a light transmissive member 14 is provided to the upper surface 17*u* of the light transmissive substrate 170.

Embodiment 2

With the method for manufacturing a light emitting device 10A in Embodiment 2 as shown in FIG. 5A, the removal of a sealing member 13 containing titanium oxide in a silicone resin shown in FIG. 2E in Embodiment 1, and the substrate 17 (sapphire) of the light emitting element 12 is performed by grinding with a grinding stone that readily cuts through the resin of the sealing member 13 and does not readily cut through the substrate 17. Consequently, as shown in FIG. 5A, the upper surface of the sealing member 13A can be removed so as to be slightly (about 5 µm, for example) lower than the upper surface of the substrate 17 of the light emitting element 12.

After this, the light transmissive member 14 is formed as in Embodiment 1. As a result, the upper surface of the light transmissive member 14 above the sealing member 13A can be formed lower than the upper surface of the light transmissive member 14 above the light emitting element 12.

Embodiment 3

With the method for manufacturing a light emitting device 10B in Embodiment 3 as shown in FIG. 5B, the removal of the substrate 17 of the light emitting element 12 and the sealing member 13 shown in FIG. 2E in Embodiment 1 is performed in the same manner as in Embodiment 1, and the substrate 17 and the resin of the sealing member 13 are ground away.

After this, a KrF excimer laser with a wavelength of 248 nm is applied from the substrate side to between the semiconductor laminate of the light emitting element 12 and the substrate 17, and the semiconductor layers constituting the semiconductor laminate absorb this energy and are ablated, separating the substrate 17. Consequently, as shown in FIG. 5B, the upper surface of the sealing member 13B can be removed so as to be slight (about 5 µm, for example) higher than the upper surface of the substrate 17 of the light emitting element 12.

After this, the light transmissive member 14 is formed just as in Embodiment 1. As a result, the upper surface of the light transmissive member 14 above the sealing member 13 can be formed lower than the upper surface of the light transmissive member 14 above the light emitting element 12.

Embodiment 4

Figure 6A:
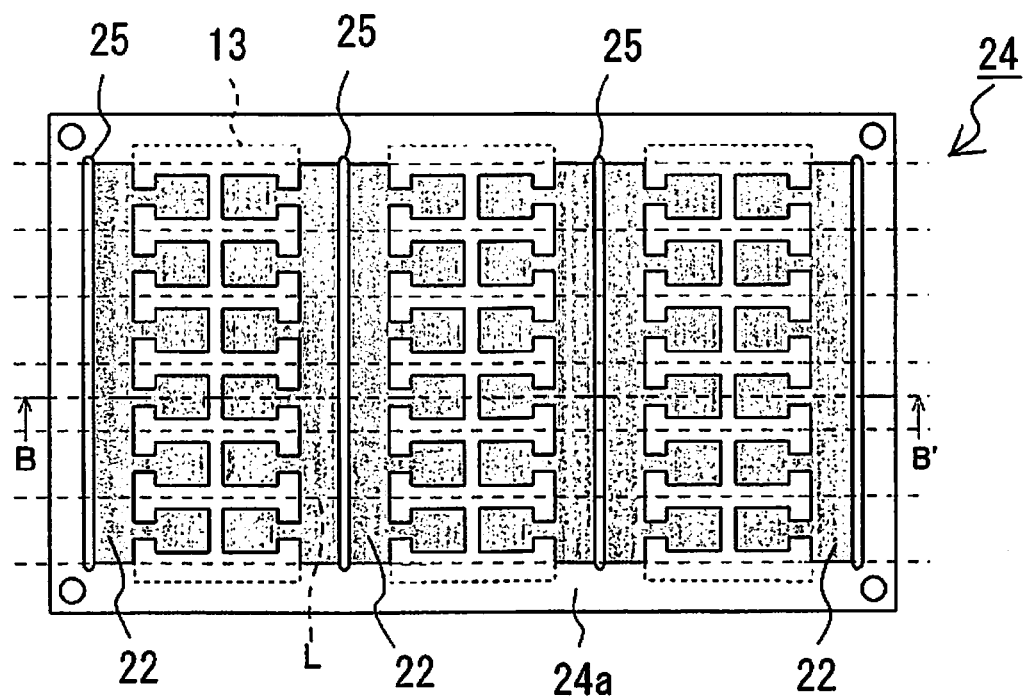
FIG. 6A is a schematic plan view illustrating a base body using still another method for manufacturing a light emitting device of another embodiment of the present invention.
Figure 6B:
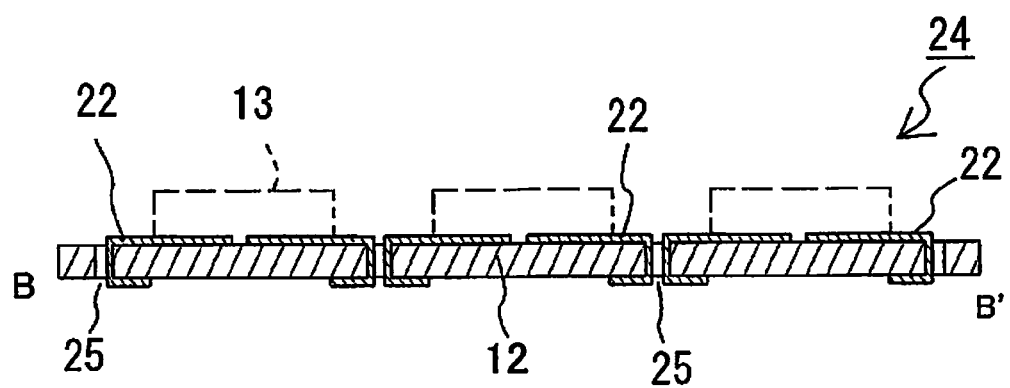
FIG. 6B is a schematic sectional view of B-B line illustrating a base body of FIG. 6A.

The light emitting device can be produced using a composite base body 24 with a composite connection terminal 22 formed on a base material 24*a* as shown in FIGS. 6A and 6B at preparing the base body as shown in FIG. 2A. The composite base body 24 is constituted by a plurality of connected pieces of the base bodies.

The composite base body 24 has slits 25 extending from the upper surface to the lower surface at the base material 24*a*. The composite connection terminal 22 is provided so as to extend continuously from the upper surface to the lower surface of the base material 22 of the composite base body 24 through the inner wall of the slit 25. FIG. 6A shows the composite base body 24 for obtaining 18 light emitting devices, but the composite base body 24 for obtaining a larger number (several hundreds to several thousands) of light emitting devices may be provided in consideration of production efficiency.

The 18 light emitting elements are connected onto the composite base body 24, a plurality of sealing members 13 (shown as dot-lines) bare molded in a batch by transfer molding so as to cover a plurality of the light emitting elements, as shown in FIGS. 6A and 6B.

The sealing members 13 and the substrates of the light emitting elements are then removed from the surface on the opposite side from the composite base body 24 side of the light emitting elements in the same manner as in Embodiment 1.

Thereafter, the upper surface of the composite base body 24 exposed from the sealing member is masked, and the upper surfaces of the light emitting elements 12 exposed from the upper surfaces of the sealing members 13 and the upper surfaces of the sealing members 13 are covered with the light transmissive member 14 by a pulse spraying method.

Then, the composite base body 24 and the sealing members 13 are cut in one direction along a division scheduled line L using dicer or laser, as shown in FIG. 6A. Accordingly, because the slit 25 is disposed, the composite base body 24 is also separated in the extending direction of the slit, so that divided light emitting devices can be obtained with a relatively small number of processes.

Embodiment 5

Figure 7:
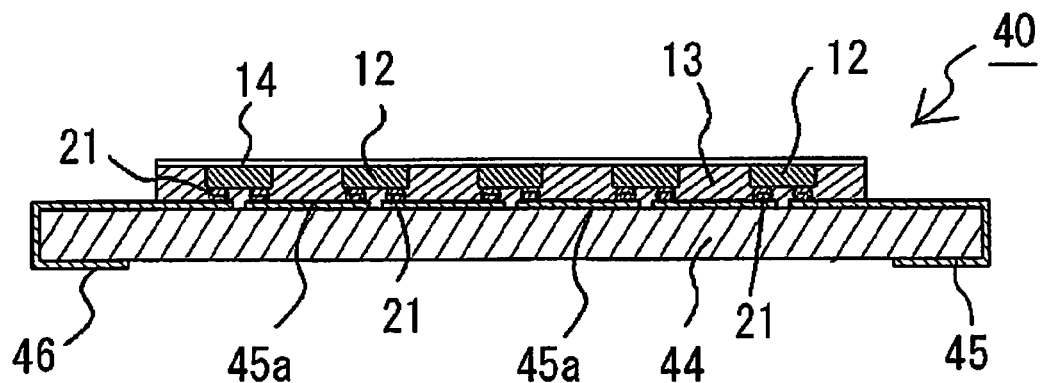
FIG. 7 is a schematic sectional view illustrating still another light emitting device manufactured by a method of an embodiment of the present invention.

As shown in FIG. 7, the light emitting device 40 manufactured in this embodiment can be manufactured by using a composite base body 44 including composite connection terminals 45, 45*a*, and 46 on which a plurality of (such as five) light emitting elements 12 are mounted on a single light emitting device 40, instead of the composite base body 24 (FIG. 6A) used for mounting a single light emitting element on a single light emitting device.

The sealing member 13 seals the five light emitting elements 12 together. The sealing member 13 and the substrates of the light emitting elements 12 are removed all at once (that is, at the same time). A light transmissive member 14 is provided that covers the removal surfaces of the sealing member 13 and the five light emitting elements 12 all together.

The light emitting device 40 shown in FIG. 7 can be manufactured by performing the various steps in the same manner as in Embodiments 1 and 4.

The composite base body 44 used here is such that the composite connection terminals 45, 45*a*, and 46 are arranged in a plurality of row directions or column directions so as to constitute a serial connection, for example, so as to be connected in a state of sharing composite connection terminals 22 that are adjacent along dotted lines L, for example, in the composite base body 24 shown in FIG. 6A.

Embodiment 6

Figure 8A:
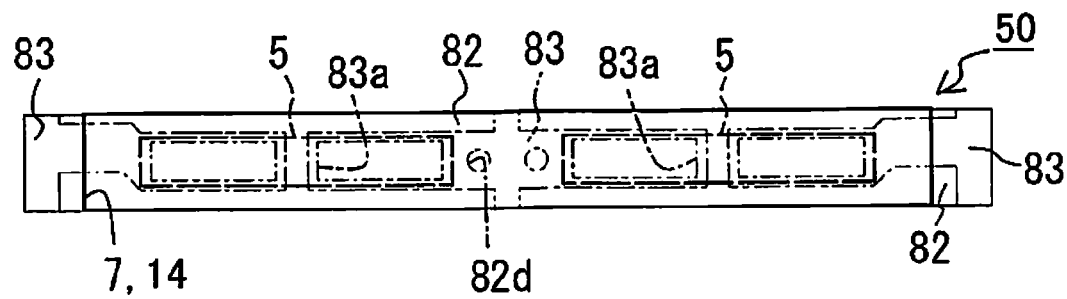
FIG. 8A is a schematic plan view illustrating still another light emitting device manufactured by a method of an embodiment of the present invention.
Figure 8B:
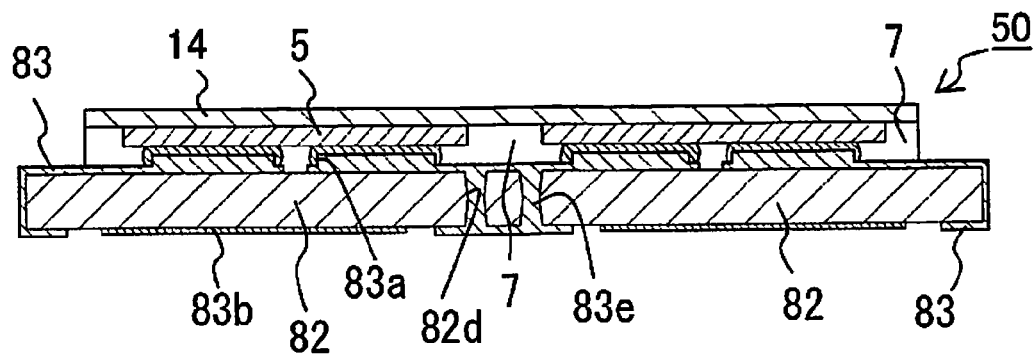
FIG. 8B is a schematic longitudinal sectional view illustrating a light emitting device of FIG. 8A.

As shown in FIGS. 8A and 8B, the light emitting device 50 in this embodiment is such that two light emitting elements 5 are mounted on a base body composed of a base material 82 having connection terminals 83 and a second connection terminal 83*e*, and a sealing member 7 is formed that seals two light emitting elements. The light emitting device 50 in this embodiment can be manufactured by substantially the same method as in Embodiment 1 or 4.

More precisely, the connection terminals 83 and the second connection terminal 83e in this embodiment have protrusions 83a. The connection terminal 83e is disposed between adjacent connection terminals 83 on the first main surface of the base body, and are joined to one electrode of each of the two light emitting elements 5. They are also provided to the second main surface of the base body, via through-holes 82d formed in the base material 82 from the first main surface side. Reinforcing terminals 83b that are separated from the connection terminals 83 are disposed on the second main surface of the base body. The connection terminal 83e and the reinforcing terminals 83b provided to the second main surface of the base body also function as heat dissipation terminals.

When the light emitting elements 5 are mounted, the protrusions 83a provide a self-alignment effect, which improves the mounting accuracy of the light emitting elements 5.

In this embodiment, the upper surface where the sealing member has been removed is substantially flush with the removal surface of the two light emitting elements where the substrate was made thinner.

INDUSTRIAL APPLICABILITY

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method for manufacturing a light emitting device comprising:
   preparing a light emitting element that includes a light transmissive substrate comprising a first main surface, a second main surface, and a side surface having a light transmitting part and a light absorbing part whose optical transmissivity is lower than that of the light transmitting part, and a semiconductor laminate that is provided to the first main surface of the light transmissive substrate;
   joining the light emitting element to an upper surface of a base body such that the base body is opposite to the side where the semiconductor laminate is provided;
   providing a support member that covers the side surface of the light emitting element and part of the base body; and
   removing the light absorbing part by thinning the light transmissive substrate from the second main surface side.

2. The manufacturing method according to claim 1, wherein the support member covers from the side surface of the light emitting element to the second main surface of the light transmissive substrate.

3. The manufacturing method according to claim 1, wherein the support member fills a gap between the light emitting element and the upper surface of the base body.

4. The manufacturing method according to claim 1, wherein the light emitting element is manufactured by a method comprising the steps of:
   laminating a plurality of semiconductor layers on a wafer to be used as the light transmissive substrate of a light emitting element;
   forming the light absorbing part along a dividing line of the wafer by irradiating the light transmissive substrate with a laser; and
   dividing the laminated plurality of semiconductor layers on the wafer and the wafer into a plurality of light emitting elements along the light absorbing part.

5. The manufacturing method according to claim 1, wherein the light absorbing part is provided at a location that is away from the second main surface of the light transmissive substrate.

6. The method for manufacturing a light emitting device according to claim 1, wherein the support member is made of a resin including a light reflection material.

7. The method for manufacturing a light emitting device according to claim 1, further comprising
   forming a wavelength conversion member containing a phosphor on an upper surface of the light emitting element after the removal of the light absorbing part.

8. The method for manufacturing a light emitting device according to claim 1, wherein the light transmissive substrate is removed so that the thickness of the light transmissive substrate is about 1 to 50 μm.

9. The method for manufacturing a light emitting device according to claim 7, wherein the wavelength conversion member is formed with the thickness of 5 to 100 μm.

10. The method for manufacturing a light emitting device according to claim 1, wherein the support member covers the light emitting element so as to be in contact with side surfaces of the light emitting element.

11. The method for manufacturing a light emitting device according to claim 7, wherein an upper surface of the wavelength conversion member above the support member is formed lower than the upper surface of the wavelength conversion member above the light emitting element.

12. The method for manufacturing a light emitting device according to claim 1, further comprising
   preparing a plurality of the light emitting elements;
   preparing a composite base body which comprises connection terminals;
   joining the plurality of light emitting elements to the connection terminals of the composite base body;
   integrally covering the plurality of light emitting elements with the support member;
   removing part of the support member and part of the light transmissive substrates of the plurality of light emitting elements; and
   dividing the support member and the composite base body to manufacture a plurality of light emitting devices.

13. The manufacturing method according to claim 12, wherein the light absorbing part is provided at a location that is away from the second main surface of the light transmissive substrate.

14. The method for manufacturing a light emitting device according to claim 12, wherein the support member is made of a resin including a light reflection material.

15. The method for manufacturing a light emitting device according to claim 12, further comprising
   forming a wavelength conversion member containing a phosphor on an upper surface of the light emitting element after the removal of the light absorbing part.

* * * * *